(12) United States Patent
Higashi

(10) Patent No.: US 8,216,884 B2
(45) Date of Patent: Jul. 10, 2012

(54) PRODUCTION METHODS OF ELECTRONIC DEVICES

(75) Inventor: Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 912 days.

(21) Appl. No.: 12/289,331

(22) Filed: Oct. 24, 2008

(65) Prior Publication Data

US 2009/0068795 A1 Mar. 12, 2009

Related U.S. Application Data

(62) Division of application No. 10/706,912, filed on Nov. 14, 2003, now Pat. No. 7,456,497.

(30) Foreign Application Priority Data

Dec. 27, 2002 (JP) .................................. 2002-381073

(51) Int. Cl.
*H01L 21/00* (2006.01)
(52) U.S. Cl. .............................. 438/121; 438/48; 438/51
(58) Field of Classification Search .................. 438/121, 438/48, 51
See application file for complete search history.

(56) References Cited

U.S. PATENT DOCUMENTS

| | | | |
|---|---|---|---|
| 5,610,431 A | 3/1997 | Martin | |
| 5,895,233 A | 4/1999 | Higashi et al. | |
| 6,140,144 A | 10/2000 | Najafi et al. | |
| 6,178,820 B1 * | 1/2001 | Kirjavainen et al. | 73/647 |
| 6,204,454 B1 * | 3/2001 | Gotoh et al. | 174/255 |
| 6,214,644 B1 | 4/2001 | Glenn | |
| 6,316,840 B1 | 11/2001 | Otani | |
| 6,335,224 B1 | 1/2002 | Peterson et al. | |
| 6,384,473 B1 | 5/2002 | Peterson et al. | |
| 6,443,179 B1 | 9/2002 | Benavides et al. | |
| 6,489,670 B1 | 12/2002 | Peterson et al. | |
| 6,495,895 B1 | 12/2002 | Peterson et al. | |
| 6,500,760 B1 | 12/2002 | Peterson et al. | |
| 6,528,344 B2 | 3/2003 | Kang | |
| 6,531,341 B1 | 3/2003 | Peterson et al. | |
| 6,538,312 B1 | 3/2003 | Peterson et al. | |
| 6,548,895 B1 | 4/2003 | Benavides et al. | |
| 6,661,084 B1 | 12/2003 | Peterson et al. | |

(Continued)

FOREIGN PATENT DOCUMENTS

JP 8-184608 7/1996

(Continued)

OTHER PUBLICATIONS

Japanese Office Action for corresponding Japanese Application 2002-381073; mailed Jan. 6, 2009.

(Continued)

*Primary Examiner* — Laura Menz
(74) *Attorney, Agent, or Firm* — Staas & Halsey LLP

(57) ABSTRACT

A method of producing an electronic device having mounted thereon a microelectromechanical system element. The method includes forming a micromachine component and electronic component for operation of the micromachine component on a substrate to form the system element, and bonding to the substrate a lid covering an active surface of the substrate and provided with wiring patterns to define an operating space for the micromachine component and electrically connecting the electronic component and the wiring patterns of the lid at a bonded part of the substrate and the lid.

12 Claims, 15 Drawing Sheets

U.S. PATENT DOCUMENTS

| | | | |
|---|---|---|---|
| 6,674,159 B1 | 1/2004 | Peterson et al. | |
| 6,792,806 B2* | 9/2004 | Ishikawa et al. | 73/514.34 |
| 6,809,413 B1 | 10/2004 | Peterson et al. | |
| 6,821,819 B1 | 11/2004 | Benavides et al. | |
| 6,844,623 B1 | 1/2005 | Peterson et al. | |
| 6,858,943 B1 | 2/2005 | Peterson et al. | |
| 6,890,834 B2* | 5/2005 | Komobuchi et al. | 438/455 |
| 6,953,985 B2 | 10/2005 | Lin et al. | |
| 6,956,283 B1 | 10/2005 | Peterson | |
| 6,965,107 B2* | 11/2005 | Komobuchi et al. | 250/338.1 |
| 7,373,835 B2* | 5/2008 | Matsubara | 73/756 |
| 7,456,497 B2* | 11/2008 | Higashi | 257/704 |
| 7,489,208 B2* | 2/2009 | Moriya | 331/158 |
| 7,568,394 B1* | 8/2009 | Keilman et al. | 73/715 |
| 7,582,505 B2* | 9/2009 | Maeda et al. | 438/75 |
| 7,602,107 B2* | 10/2009 | Moriya et al. | 310/348 |
| 7,629,806 B2* | 12/2009 | Hosaka | 324/755.06 |
| 7,635,606 B2* | 12/2009 | Warren et al. | 438/64 |
| 7,668,415 B2* | 2/2010 | Tyger | 385/14 |
| 7,692,292 B2* | 4/2010 | Higashi et al. | 257/710 |
| 7,746,537 B2* | 6/2010 | Natarajan et al. | 359/290 |
| 7,838,997 B2* | 11/2010 | Trezza | 257/778 |
| 7,884,483 B2* | 2/2011 | Trezza et al. | 257/777 |
| 7,932,786 B2* | 4/2011 | Moriya et al. | 331/68 |
| 7,933,476 B2* | 4/2011 | Tyger | 385/18 |
| 7,989,927 B2* | 8/2011 | Shiraishi et al. | 257/621 |
| 8,033,177 B2* | 10/2011 | Keilman et al. | 73/718 |
| 2002/0001873 A1 | 1/2002 | Kang | |
| 2003/0230798 A1 | 12/2003 | Lin et al. | |
| 2004/0016995 A1* | 1/2004 | Kuo et al. | 257/678 |
| 2005/0046016 A1 | 3/2005 | Gilleo | |
| 2005/0167795 A1* | 8/2005 | Higashi | 257/678 |
| 2006/0086890 A1* | 4/2006 | Chao et al. | 250/208.1 |
| 2006/0169049 A1* | 8/2006 | Matsubara | 73/754 |
| 2006/0284215 A1* | 12/2006 | Maeda et al. | 257/215 |
| 2007/0108634 A1* | 5/2007 | Higashi et al. | 257/787 |
| 2007/0120614 A1* | 5/2007 | Moriya et al. | 331/158 |
| 2007/0152148 A1* | 7/2007 | Chao et al. | 250/239 |
| 2007/0252655 A1* | 11/2007 | Moriya | 331/158 |
| 2008/0002460 A1* | 1/2008 | Tuckerman et al. | 365/158 |
| 2009/0068795 A1* | 3/2009 | Higashi | 438/121 |
| 2009/0095974 A1* | 4/2009 | Taguchi et al. | 257/99 |
| 2009/0108411 A1* | 4/2009 | Shiraishi et al. | 257/621 |
| 2009/0205432 A1* | 8/2009 | Keilman et al. | 73/718 |
| 2009/0270740 A1* | 10/2009 | Keilman et al. | 600/486 |
| 2010/0155862 A1* | 6/2010 | Shiraishi et al. | 257/415 |
| 2011/0156242 A1* | 6/2011 | Sakaguchi et al. | 257/698 |
| 2011/0281138 A1* | 11/2011 | Yoshioka et al. | 428/815 |
| 2012/0056279 A1* | 3/2012 | Huang et al. | 257/415 |

FOREIGN PATENT DOCUMENTS

| | | |
|---|---|---|
| JP | 10-048244 | 2/1998 |
| JP | 11-354660 | 12/1999 |
| JP | 2001-141463 | 5/2001 |
| JP | 2002-009265 | 1/2002 |
| JP | 2002-43463 | 2/2002 |
| WO | 99/67818 | 12/1999 |
| WO | 02/01633 | 1/2002 |
| WO | 02/055431 | 7/2002 |

OTHER PUBLICATIONS

G. A. Riley et al., "Stud Bump Flip Chip Assembly of MEMS and MOEMS," Proceedings of the SPIE, International Symposium on Microelectronics, vol. 4587, Oct. 2001, pp. 662-665.

K. Jongbaeg et al., "Ultrasonic Bonding of In/Au and Aval for Hermetic Sealing of MEMS Packaging," IEEE International Micro Electro Mechanical Systems Conference, Proceedings of the IEEE, Jan. 2002, pp. 415-418.

M. Heschel, "Stacking Technology for a Space Constrained Microsystem," Micro Electro Mechanical Systems, 1998, MEMS 98, Proceedings, IEEE, Jan. 1998, pp. 312-317.

H. Park et al., "Packaging of the RF-MEMS Switch," Design, Characterization and Packaging for MEMS and Microelectronics II, Proceedings of the SPIE, vol. 4593, Dec. 2001, pp. 234-243.

Kim et al., "Ultrasonic Bonding of In/Au and Al/Al for Hermetic Sealing of MEMS Packaging," MEMS 2002, IEEE International Micro Electro Mechanical Systems Conference, Proceedings of the IEEE, Jan. 2002, pp. 415-418.

Partial European Search Report dated May 9, 2005 of Application No. EP 03 25 7126.

Partial European Search Report and Annex of Application No. EP 03 25 7126 dated May 9, 2005.

European Search Report and Annex of Application No. EP 03 25 7126 dated Jul. 20, 2005.

* cited by examiner

PRODUCTION METHODS OF ELECTRONIC DEVICES

CROSS-REFERENCE TO RELATED APPLICATIONS

This application is a divisional application of U.S. patent application Ser. No. 10/706,912, filed Nov. 14, 2003 now U.S. Pat. No. 7,456,497 and claims the priority benefit of Japanese Application No. 2002-381073, filed Dec. 27, 2002, the disclosures of which are herein incorporated in their entirety by reference.

BACKGROUND OF THE INVENTION

1. Field of the Invention

The present invention relates to an electronic device, more particularly to an air-tightly sealed electronic device having mounted thereon a microelectromechanical system element or other functional elements, and a method of production of the same. The present invention also relates to an improved method of securing a lid useful for production of such an electronic device.

2. Description of the Related Art

In recent years, functional components, functional elements, functional devices and the like based on microelectromechanical systems (MEMS) (hereinafter referred to overall as "MEMS elements") have come into attention. MEMS elements are extremely small in size, yet exhibit complicated and sophisticated functions. An MEMS element usually comprises a substrate having formed integrally with its active surface a mechanically operating micromachine structure (hereinafter referred to as a "micromachine component"), an electronic component for operating the micromachine component, etc. A micromachine component generally can be produced by micromachining. Specific examples of micromachine components include for example relays, sensors, etc. Electronic devices carrying such micromachine components can be advantageously utilized in the field of information communications, automobiles, household electrical apparatuses, industrial machinery and others.

Looking at several examples of MEMS element-carrying devices, for example, there is known the chip sealing type semiconductor device shown in FIG. 1 (see, Japanese Unexamined Patent Publication (Kokai) No. 8-184608). In this semiconductor device, a semiconductor substrate 151 has formed on it an IC chip 152 and has further formed on it a broad width metal bridge (Au ribbon) 108 covering the same. The metal bridge 108 is melt bonded to the semiconductor substrate 151 through bonding lands (A1) 155. Note that when forming the metal bridge 108, attention must be paid so that it does not contact bonding wires 153 and others in a cavity 109. The metal bridge 108 is sealed by an epoxy resin 110, then coated with a conductive paste 111. By configuring the device in this way, it is possible to secure a protective function by the metal bridge 108 and epoxy resin 110 and further to achieve a noise-seal effect by the conductive paste 111. The IC chip 152 on the semiconductor substrate 151 may also be a micromachine, for example, a rotor part of a micromotor.

Further, as shown in FIG. 2, there is known a surface mounting type chip scale package invented for eliminating the inconveniences of wire bonding (see, Japanese Unexamined Patent Publication (Kokai) No. 2002-43463). In this package, an element-supporting first substrate (silicon substrate etc.) 206 has an element active region 207 on which various types of MEMS elements are formed. Further, the element-supporting first substrate 206, as illustrated, has a cover-use second substrate (silicon, stainless steel, Coval™, copper, etc.) 212 filled with glass or ceramic 213 bonded to it by a conductive bonding material layer 210. The conductive bonding material layer 210 is formed from, for example, solder, gold, an anisotropic conductive sheet, a conductive epoxy resin, etc. Therefore, the cover-use second substrate 212 can be bonded by for example soldering, sheet bonding, epoxy bonding, anoding bonding, etc. Upon such bonding, a cavity 208 is formed. Further, during this bonding, element electrodes and bottom electrodes 211 each formed by Au, Al etc. are bonded so as to be conductive by the conductive bonding material layer 210. External interconnect electrodes 214 formed by Au, Al, etc. are electrically connected with the device electrodes 209 by the cover-use second substrate 212.

In the prior art, as explained above, when placing an MEMS element or other functional elements on the substrate of a package and the like to produce an electronic device, generally use is made of the method of fixing the functional element on the substrate by an adhesive, bonding sheet, etc., then using gold wires or other bonding wires for connecting the wirings, finally securing a lid by an adhesive (for example, epoxy-based adhesive), soldering (for example, silver paste), or other bonding means. Usually, the bonding means is coated on the four corners of the lid, then the lid is attached to the substrate and heated to secure it. With this method of securing the lid, however, the following numerous problems remain to be solved.

(1) Since the wire bonding system is used, the size of the package becomes larger.

(2) Since an adhesive is used as a bonding means, heat treatment at a raised temperature is required for curing. Deterioration of the element due to heat and adverse effects on the element characteristics due to the decomposed gas derived from the adhesive at the time of heating occur. Such adverse effects due to heating are important problems in electronic devices having mounted thereon functional elements provided with drive components and the like such as MEMS elements.

(3) When using a drive component, for example, a drive IC, in combination with an MEMS element, a package carrying the drive component etc. is necessary in addition to the package carrying the MEMS element, so a complicated structure, a drop in yield, a rise in production cost, etc. are unavoidable.

(4) With the method of resin sealing or use of a metal bridge, it is not possible to obtain a completely air-tight seal of the device.

SUMMARY OF THE INVENTION

An object of the present invention is to provide an electronic device for mounting an MEMS element or other functional elements, which is small and compact, is free from deterioration of element characteristics due to heat treatment etc., and which is sealed completely air-tight.

Another object of the present invention is to provide a method of production of an electronic device of the present invention which is simple in the production steps and easy to work.

Another object of the present invention is to provide a method of securing a lid useful for production of an electronic device.

The above objects and other objects of the present invention will be easily understood from the following detailed description.

The present invention provides, in one aspect thereof, an electronic device having mounted thereon a microelectromechanical system element comprising a micromachine component and electronic component for operation of the micromachine component formed on a substrate, characterized in that an operating space for the micromachine component is defined by the substrate and a lid bonded covering an active surface of the substrate, and the electronic component and wiring patterns of the lid are electrically connected at a bonded part of the substrate and the lid.

Further, the present invention provides, in another aspect thereof, a method of production of an electronic device having mounted thereon a microelectromechanical system element, characterized by comprising the steps of: forming a micromachine component and electronic component for operation of the micromachine component on a substrate to form the system element; and bonding to the substrate a lid covering an active surface of the substrate and provided with wiring patterns to define an operating space for the micromachine component and electrically connecting the electronic component and the wiring patterns of the lid at a bonded part of the substrate and the lid.

Further, the present invention provides, in still another aspect thereof, an electronic device having mounted thereon a functional element, characterized in that an element-carrying space is defined by a device body and a lid covering the same, the device body and the lid are sealed air-tight by a continuous ultrasonic bonded part formed in contact with the outer periphery of the element-carrying space side of the members without interruption, the air-tightly sealed element-carrying space has arranged inside the space the functional element fixed to the device body and/or the lid, and the functional element is electrically connected to an outernal element and others.

Furthermore, the present invention provides, in another aspect thereof, a method of production of an electronic device having mounted thereon a functional element, characterized by comprising the steps of: securing the functional element to a device body and/or lid; and bonding the device body and the lid to define an element-carrying space, forming a continuous ultrasonic bonded part at the device body and the lid in contact with an outer periphery of the element-carrying space side of the members without interruption, and thereby sealing air-tightly the element-carrying space.

In addition, the present invention provides, in another aspect thereof, a method of covering and securing a lid in an electronic device having mounted thereon a functional element, characterized by forming securing regions in predetermined patterns at an outer periphery of a device body carrying the functional element, bringing corresponding parts of the lid into abutment with the securing regions, and sealing air-tight the device body and the lid by ultrasonic bonding.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
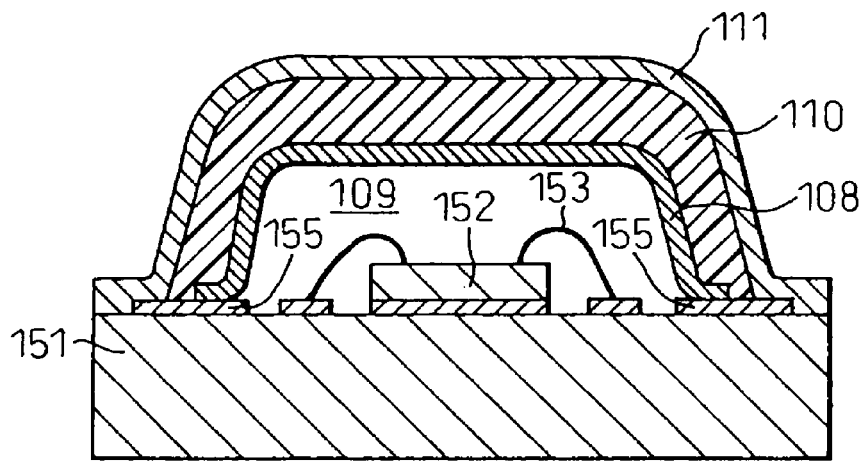
FIG. 1 is a sectional view of an example of the prior art chip-sealing type semiconductor device.
Figure 2:
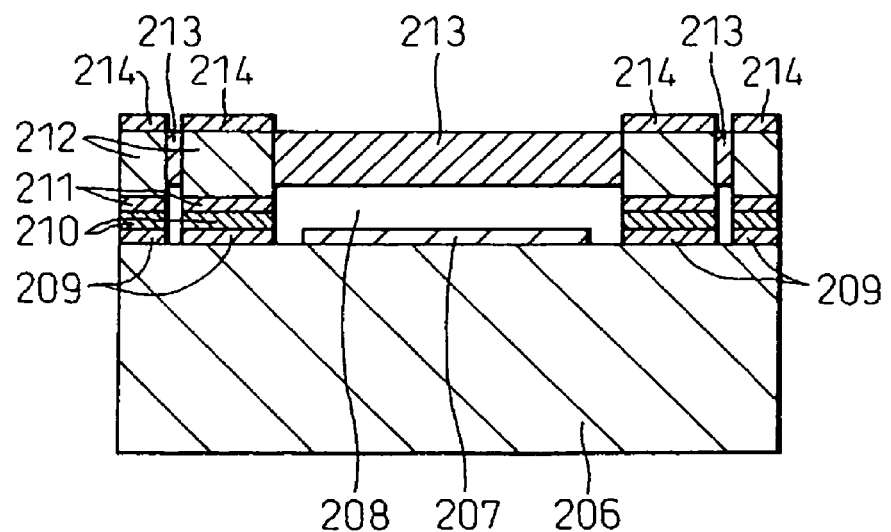
FIG. 2 is a sectional view of an example of the prior art surface mounting type chip scale package.

The present invention resides in an electronic device having mounted thereon a microelectromechanical system element or other functional elements and a method of production of the same as well as a method of securing a lid in an electronic device. Below, these aspects of the invention will be explained with reference to preferred embodiments thereof.

The electronic device of the present invention includes various electronic devices broadly used in the field of information communications, automobiles, household electrical apparatuses, industrial machinery and others. The "electronic device" referred to herein is comprised of a substrate serving as a device body, at least one functional element mounted on the front surface, back surface and/or inside of the substrate, and a lid (also called a cover and the like) covering the functional element-mounting surface of the substrate. These electronic devices may also have additional members such as heat dissipating plates and others, if necessary. Further, if necessary, functional elements may be mounted on the front surface, back surface, and/or inside of the lid. Of course, wirings (interconnects), electrodes, external terminals, and other conventional device components or elements may be attached to these electronic devices.

In the electronic device of the present invention, the functional elements to be mounted thereon are generally comprised of two types of elements.

The first functional element is an MEMS element or device. Normally, this includes all microprocessed elements produced by micromachining or other technology. An MEMS element can be produced usually by building into the active surface of a semiconductor substrate such as a silicon substrate or other substrate a micromachine component using a process similar to the process for production of a semiconductor device and simultaneously building in an electronic component (for example, electronic circuit and others) for operating the micromachine component. Specific examples of micromachine components for MEMS elements, though not limited to those listed below, include for example electronic circuits, semiconductor chips, relays, sensors, capacitors, inductors, actuators and the like. These micromachine components may be used alone or may be used in combinations of two or more types. Further, these micromachine components preferably can be arranged in proximity with other components when used in combination with other functional components, for example, driving components such as drive ICs and the like or passive components such as capacitors, resistors and the like, and therefore enable the achievement of the advantages of higher speed of processing, smaller size of the device, etc. Hereinafter, the electronic device having mounted thereon an MEMS element will be called as an "MEMS element mounting or carrying electronic device".

The second functional element is a functional element other than an MEMS element, that is, "other functional element". Here, the "other functional element", while not limited to those listed below, includes electronic circuits, IC chips, LSI chips, and other semiconductor chips, relays, sensors, capacitors, inductors, actuators, biochips and others. Further, an electronic device having mounted thereon such "other functional device" will be referred to as a "functional element mounting or carrying electronic device". Note that unless otherwise indicated in the specification, when referring to a "functional element", both an MEMS element and other functional element are included.

As explained in detail below, in the electronic device of the present invention, wire bonding is not used when mounting the MEMS element or other functional element, so the device can be made smaller in size and more compact. Further, since the MEMS element and the like as well as drive IC, passive component and the like can be formed integrally on the substrate, the device can be made smaller in size and high speed processing can be realized. Further, it becomes possible to produce a device by a wafer level package process and therefore possible to achieve reduced costs and easier testing.

Further, since the substrate and lid are bonded by ultrasonic bonding without using an adhesive or bonding sheet, not only it is possible to increase the bond strength, but also it is possible to impart a higher degree of air-tight sealing to the resulting operating space or element mounting space for the micromachine component. Further, since the ultrasonic bonding can be usually performed at a relatively low temperature of from a room temperature to about 100° C. to about 150° C., it is possible to prevent the inconveniences which could not be avoided when using an adhesive and the like such as the generation of undesired decomposed gas during the processing or saturation of such gas in the operating space or element mounting space.

First, an MEMS element mounting electronic device will be explained.

In the MEMS element mounting electronic device of the present invention, an element mounting space is defined by a device body (hereinafter called as the "MEMS substrate") and a lid covering the surface of the MEMS substrate. This element mounting space is in particular the space required for operation of a micromachine component, and therefore, it will also be referred herein to as an "operating space". The operating space defined by the MEMS substrate and lid can take various forms in accordance with the MEMS substrate and lid, but when considering the compactness of the device and ease of processing, a box shape, cylindrical shape or the like is advantageous. Further, to form such an operating space or expand that space, it is also possible to prepare a relatively thick substrate or lid and form a cavity (recessed portion facing an operating space side) at a predetermined position. The cavity can be formed by for example etching or other chemical processing or drilling or other machining in accordance with the material of the MEMS substrate or lid. By containing the MEMS element in the cavity portion, it is possible to make the resulting electronic device smaller in size.

In the MEMS element mounting electronic device, the MEMS substrate can be produced from various materials. As a suitable substrate material, for example silicon or other semiconductor materials can be mentioned. Further, it is also possible to additionally apply for example a silicon oxide film or other insulating film or a film exhibiting another function on the surface of the substrate. Further, if necessary, it is also possible to use a single-sided or double-sided copper clad laminate, built-up circuit board and the like as the MEMS substrate.

The lid used in combination with the MEMS substrate, like the substrate, is not limited to a specific material. Generally, it can be produced from various materials commonly used as lids in electronic packages or other packages. As a suitable lid material, while not limited to those listed below, silicon, sapphire, glass or other inorganic materials, glass epoxy, epoxy resin or other organic resin materials, stainless steel, copper or other metal materials, or other materials can be mentioned. These lid materials are usually used alone, but may also be used in combinations of two or more types in accordance with need. Further, the lid or a part of the same may be replaced by a glass plate, lens and the like to obtain an optical function in addition to the air-tight sealing function. Further, in accordance with need, it is also possible to form an additional film on the surface of the lid or apply rust-preventing treatment and the like.

In the MEMS element mounting electronic device, an operating space is created by bonding the MEMS substrate and lid. The operating space is preferably formed by ultrasonic bonding of the MEMS substrate and lid. The operating space formed is sealed air-tight by an ultrasonic bonded part and is held at a high degree of vacuum. Further, since an adhesive or high temperature treatment is not required for ultrasonic bonding, there is no deterioration of the device characteristics and decomposed gas adversely affecting the device characteristics does not fill the inside of the operating space.

According to another embodiment, in combination with the MEMS substrate and lid, it is possible to use an intermediate member between these members for bonding the two, that is, a second substrate. The type of the intermediate member is not particularly limited and may be a flat plate or other shape. It is preferable to provide an opening at a position at the substantial center of the flat-plate shaped intermediate member and make that opening function as part of the operating space.

The intermediate member can be produced from various materials. As a suitable material of the intermediate member, while not limited to those listed below, for example, silicon, glass or other inorganic materials, glass epoxy or other organic resin materials, metal material and the like may be mentioned. Alternatively, it is also possible to use a copper clad laminate or other various types of printed circuit boards as the intermediate member. Note that the opening in the intermediate member may be formed by drilling, etching, or other conventional technique.

The ultrasonic bonding may be performed in accordance with any conventional method. For example, the processing environment may be usually a room temperature, and, if necessary, the processing may be performed at a relatively low temperature of up to about 100° C. or up to about 150° C. As other conditions suitable for ultrasonic bonding, for example, the following can be mentioned:

Amplitude frequency: About 50 to 100 kHz
Amplitude: About 1 to 10 μm
Pressure: About 1 to 1,000 g/mm$^2$ When ultrasonical bonding is carried out between the MEMS substrate and lid, between the MEMS substrate and intermediate member, between the intermediate member and lid, or between other members in accordance with the present invention, it is preferable to first clean the surfaces of these members before bonding treatment. This is because it enables the two members to be bonded more strongly. Further, depending on the material of the MEMS substrate, lid, intermediate member and the like, sometimes the members will not bond or will not bond well. In such a case or to make the bond strength between the members greater, it is preferable to selectively impart a bonding medium for strengthening the bond to at least one of, preferably all of, the MEMS substrate, lid, intermediate member, and other members, then ultrasonically bond them.

The bonding medium able to assist the ultrasonic bonding, while not particularly limited, usually is advantageously of the form of plating, bumps and others. These bonding media usually can be advantageously formed from a conductor metal. As a suitable conductor metal, while not limited to those listed below, gold, aluminum, copper, or an alloy thereof may be mentioned. Further, for example, the conductor plating may be a single layer or a multilayer structure of two or more layers. When using multilayered plating structure as the bonding medium, it is possible to increase the bond strength with respect to the underlayer and the bond strength with respect to the other material to maximum extent.

Explaining one preferable example of ultrasonic bonding, the electrodes of the MEMS element are generally comprised of aluminum or copper. Therefore, when bonding wiring patterns of the lid to the electrodes by ultrasonic bonding, for example, it is also possible to gold plate the electrodes and bond them with the gold bumps formed on the wiring patterns for Au—Au bonding. Further, it is also possible to bond gold bumps formed on the wiring patterns to electrodes comprised of aluminum for Au—Al bonding. Further, it is also possible to gold plate the electrodes and bond them with wiring patterns comprised of copper for Au—Cu bonding or bond gold bumps formed on the wiring patterns with electrodes comprised of copper for Au—Cu bonding. That is, in the practice of the present invention, the ultrasonic bonding can be performed in various ways.

Further, the MEMS substrate, lid, intermediate member and other members may have the same types of bonding media at both of the two members to be bonded, for example conductor plating or conductor bumps, or if not may have a conductor plating at one and conductor bumps at the other. Since the method of forming the conductor plating or conductor bumps is well known, a detailed explanation will be omitted herein.

In the MEMS element mounting electronic device of the present invention, in addition to bonding the MEMS substrate, lid, and, if necessary, intermediate member (preferably, by using ultrasonic bonding) to form an air-tightly sealed operating space, it is possible to secure or build in a micromachine component on the substrate by any means inside the operating space. Micromachining technology is generally useful. Alternatively, it is possible to secure the micromachine component to the MEMS substrate by flip-chip connection. Here, this flip-chip connection can be performed in accordance with conventional methods, for example, through conductor bumps or solder balls. By utilizing this connection method, not only is it possible to reduce the element mounting region and make the device smaller, but also it is possible to avoid inconveniences such as wire contact caused in the wire bonding method.

In the MEMS element mounting electronic device of the present invention, it is possible to use the micromachine component for the MEMS element independently of course, but preferably it is possible to advantageously use it in combination with other functional components, for example, passive components, driving components (drive ICs) and others. In the electronic device of the present invention, it is possible to realize such combinations of element and/or component while they are brought close together, so it is possible to achieve a higher processing speed, prevent noise, and reduce the size of the device.

Further, in the MEMS element mounting electronic device of the present invention, for connecting the built in micromachine component or other functional component with various external circuits, element and others, it is preferable to provide the MEMS substrate, lid, or intermediate member with conductor-filled vias formed passing through them in the thickness direction. This is because by forming the conductor-filled vias, it is possible to shorten the connection paths in the device, increase the processing speed, and prevent noise. Further, it is possible to form rerouted wiring and the like in combination with formation of the conductor-filled vias. This is because it is possible to simultaneously perform a plurality of processing by a single process and possible to shorten the process and reduce costs. It is advantageous to provide external connection terminals (for example, Au bumps) and the like at the end faces (exposed surfaces) of the conductor-filled vias.

The conductor-filled vias may be formed in accordance with any conventional method. For example, conductor-filled vias can be advantageously formed by forming through holes at predetermined locations of the substrate or lid, then filling them with for example gold, aluminum, copper, or an alloy thereof or other conductor metals. Further, it is possible to form rerouted wirings and other wiring patterns simultaneously with progress in filling the conductor metal.

In the MEMS element mounting electronic device of the present invention, it is advantageous if the outside of the ultrasonic bonded part further has a sealing resin bonded surrounding the same. This sealing resin is preferably formed without interruption at the outside of the ultrasonic bonded part. This is because this enables the strength of the ultrasonic bonded part to be increased and at the same time the effect of air-tight sealing to be raised. The sealing resin is for example an epoxy resin, polyimide resin and the others, and can be dispensed in predetermined amounts by potting and the like.

Further, to more reliably form the air-tightly sealed operating space, it is preferable that the MEMS substrate, lid, and, if necessary, the intermediate member further have a second continuous ultrasonic bonded part formed in contact with the outer periphery portion, at the operating space sides, of these members without interruption. The ultrasonic bonding may be performed as follows. Further, it is advantageous to apply and cure a sealing resin to the outside of the second continuous ultrasonic bonded part to surround the ultrasonic bonded part for reinforcement.

The second ultrasonic bonded part preferably is formed in the shape of a narrow width, uninterrupted frame. In particular, it can be advantageously formed from a seal ring (for example, bumps and the like), conductor plating and the like. The frame width of the ultrasonic bonded part is not particularly limited, but to reduce the size of the electronic device, it is preferable to be about 2 mm or less, more preferably about 1 mm or less. When for example forming the ultrasonic bonded part by bonding conductor platings, forming the plating film at the MEMS substrate side to a relatively broad width and forming the plating film of the lid to be brought into contact with it in a relatively narrow width would be effective for forming a stronger, more reliable ultrasonic bonded part.

Further, while explained in detail below, the MEMS element mounting electronic device of the present invention may be produced one at a time at the chip level, but it is advantageous to batch-wise produce a plurality of electronic devices all together by a wafer level package process and then cut out the individual electronic devices. This is because not only is it possible to produce a large number of electronic devices all together, but also inspection of the products becomes easier and the production costs can be greatly reduced.

The MEMS element mounting electronic device according to the present invention can be produced in accordance with various techniques, but preferably can be produced by various methods including the following steps:

a step of building a micromachine component and an electronic component for operation of the micromachine component in and/or on the substrate to form an MEMS substrate (MEMS element), and a step of bonding the MEMS substrate and the lid by ultrasonic bonding to define a hermetic operating space.

Typically, the method of the present invention can be advantageously carried out by the following series of steps:

(1) a step of preparing a substrate, for example, a silicon substrate or other semiconductor substrate, (2) a step of forming through holes, cavities and the like in accordance with the design of the intended device at an element mounting surface (active surface) or a surface at the side of the operating space of the prepared substrate, (3) a step of filling the through holes with a conductor metal, forming rerouted wiring patterns etc. on the substrate, (4) a step of plating a conductor metal or forming bumps etc. for use in ultrasonic bonding, (5) a step of cutting the substrate to obtain packages each comprising a substrate provided with a cavity, conductor-filled vias and the like (the step of cutting the substrate may also be left to a later step in the case of using a wafer size package process), and (6) a step of attaching each package to a separately fabricated MEMS substrate (MEMS element) and ultrasonically bonding them.

Note that this method of production is one example, and therefore the steps may be changed in various ways within the scope of the present invention. For example, it is also possible to switch the order of the steps or add new steps. Details of the individual steps will be easily understood from the above explanation of the electronic devices.

Explaining more specifically, when the MEMS element mounting electronic device of the present invention (MEMS device) is produced by using, for example, a silicon substrate as a lid, and its chip size package (CSP) is produced by attaching an MEMS substrate (MEMS element) to the silicon substrate, it can be produced by the following procedure.

Production of Lid:

1) Preparation of Silicon Wafer
   A silicon wafer is prepared and its surface is processed clean.
2) Formation of Through Holes and Cavities
   A resist is coated to a cavity-forming surface of the silicon wafer and the resist film is patterned in accordance with the patterns of the intended through holes and cavities to obtain a resist mask. Next, the wafer is etched through this resist mask to obtain through holes and cavities in the desired shapes and sizes. Note that the formation of the cavities may also be omitted.
3) Formation of Insulating Film
   After the resist mask was dissolved away, the silicon wafer is oxidized to form an insulating film (silicon oxide film) on its surface.
4) Formation of Conductor-Filled Vias and Rerouted Wirings
   A resist is coated on the cavity surfaces of the silicon wafer, then the resist film is patterned so that the via and reinterconnect forming regions are exposed to thereby obtain a resist mask. Next, copper (Cu) is plated in the presence of the resist mask to obtain Cu-filled vias and rerouted wirings. It is also possible to form other wiring patterns, electrodes and others by this plating step, if desired.
5) Formation of Au Bumps
   Au bumps are formed on the end faces of the Cu-filled vias for use as bonding media at the time of ultrasonic bonding. Note that if necessary, it is also possible to form Au plating instead of Au bumps.
6) Dicing of Silicon Wafer
   The wafer is cut apart by a dicer and the like. Silicon chips provided with cavities, Cu-filled vias, rerouted wirings and the like are thereby obtained. These silicon chips are used as lids for MEMS devices. Note that when starting from silicon chips instead of a silicon wafer, this step is not required.

Production of MEMS Device:

7) Preparation of MEMS Element Forming Silicon Substrate
   An MEMS element forming silicon substrate (MEMS chip) is separately prepared. To make the ultrasonic bonding more reliable, it is preferable to provide for example Au plating as a bonding medium at the ultrasonic bonding locations (locations corresponding to Au bumps of lid) serving also as external connection terminals of the MEMS chip. That is, preferably, for example Au plating and the like is provided in advance at the external connection terminals, made from aluminum or copper, of the MEMS chip.

8) Lamination of MEMS Chip and Lid

The MEMS chip and lid are accurately positioned and laminated. A state where the Au bumps of the lid and the Au plating of the MEMS chip are abutting against each other is obtained. Further, an operating space in which the MEMS micromachine component can operate is secured between the MEMS chip and lid.

9) Ultrasonic Bonding

Ultrasonic bonding is performed while the lid is mated with the MEMS chip. The conditions of the ultrasonic bonding are, for example, treatment temperature: room temperature to about 150° C., amplitude frequency: about 50 to 100 kHz, an amplitude: about 1 to 10 μm, and pressure: about 1 to 1,000 g/mm$^2$.

10) Sealing by Resin

To further strengthen the ultrasonic bonded part formed in the above step, it is preferable to further seal the perimeter of the ultrasonic bonded part by a resin. As the sealing resin, for example, an insulating epoxy resin and the like can be used.

11) Formation of External Connection Terminals

For use as external connection terminals, for example, solder balls (for example, Pb—Sn balls, Ag—Cu—Sn balls and the like) are attached to the back side of the lid (surface at opposite side to operating space).

Through such a series of production steps, small sized MEMS devices are produced. Each device can be shipped after passing predetermined inspections.

In another aspect, the present invention resides in a functional element-mounted electronic device characterized by sealing air-tight an element mounting space for carrying a functional element. In this electronic device, the functional element is not limited to an MEMS element as in the above aspect of the invention, but rather is generally "other functional element" (explained earlier). Further, the means for securing the functional element may be flip-chip connection, wire bonding connection, or other conventional connection methods. The point is that in this electronic device, the device body (substrate) and lid is bonded through an ultrasonic bonded part formed without interruption at their outer periphery, instead of partial coating of an adhesive requiring high temperature heating. Further, since the ultrasonic bonded part is designed for air-tight sealing, the functional element can be electrically connected with external elements and others through another ultrasonic bonded part formed separately.

The present invention also resides in a method of production of such a functional element-mounted electronic device. This production method of the present invention is characterized by comprising:

a step of securing the functional element to a device body and/or lid; and a step of bonding the device body and the lid to define an element mounting space, forming a continuous ultrasonic bonded part at the device body and the lid in contact with an outer periphery of the element mounting space side of those members without interruption, and thereby sealing air-tightly the element mounting space.

The functional element-mounted electronic device and its method of production according to the present invention can be carried out in accordance with the above-described MEMS element mounting electronic device and its method of production.

In another aspect, the present invention resides in a method of securing a lid in the production of an electronic device. In the present invention, the configuration of the electronic device is not particularly limited. The method of the present invention can be applied to electronic devices of any types of structures. Typically, the electronic device, as in the above-described electronic device, is comprised of a substrate serving as the device body, at least one functional element carried on the front surface, back surface and/or inside of the substrate, and a lid covering the functional element carrying surface of the substrate. If necessary, it may also have an additional member such as a heat dissipating plate and the like. Further, the functional element may be carried on the front surface, back surface and/or inside of the lid. Furthermore, the substrate or lid may be provided with a cavity for defining or expanding the element mounting space or conductor vias (filled vias), wirings, electrodes, external electrodes and others for electrical connection with the outside.

The method of securing the lid according to the present invention is characterized by setting securing regions by predetermined patterns, preferably narrow width stripe patterns, at the outer periphery of the device body carrying the functional element, bringing the corresponding parts of the lid into abutment with the securing regions, and sealing them air-tight by ultrasonic bonding. The securing regions are preferably comprised of plating, bumps and the like as explained above.

The method of the present invention preferably further comprises the step of applying a sealing resin to the outside of the formed ultrasonic bonded part to surround and bond the same. Further, this securing method is preferably carried out after conductor plating and/or conductor bumps were formed as bonding media on the front surfaces of the package body and lid. Ultrasonic bonding is made through these bonding media. Further, this securing method is preferably carried out by forming the conductor plating and/or conductor bumps from gold, aluminum, copper or an alloy thereof. These preferred embodiments and other embodiments will be easily understood from the above explanation of electronic devices and their production methods.

EXAMPLES

Next, examples of the present invention will be explained with reference to the attached drawings. Note that the following examples are for explaining the present invention specifically to increase its understanding. Needless to say, the present invention is not limited to these examples. In particular, in the practice of the present invention, it is possible to diversify the actions and effects obtained by combining the steps described in the following examples as desired.

Figure 3:
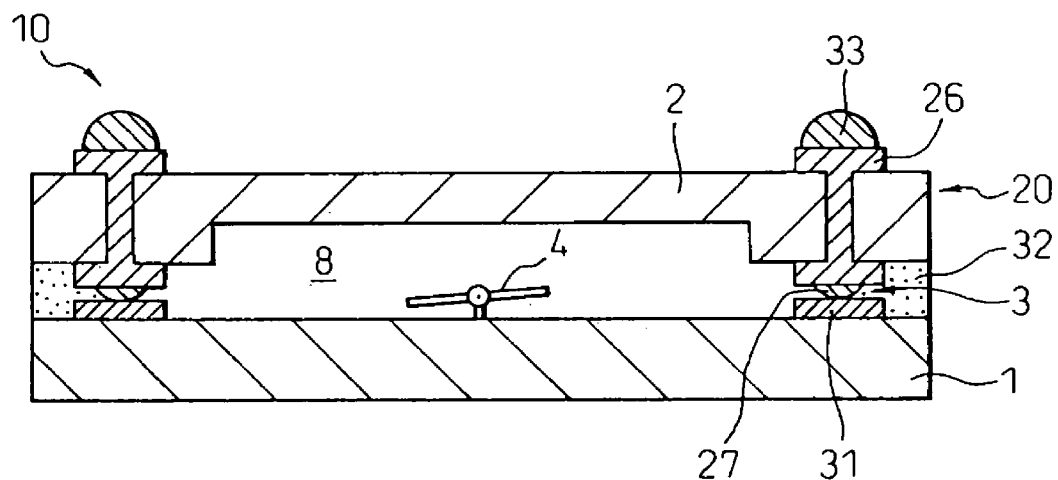
FIG. 3 is a sectional view of a preferable example of an MEMS element-mounted electronic device according to the present invention.

FIG. 3 is a sectional view showing a preferable example of an MEMS element mounting electronic device according to the present invention. The illustrated electronic device 10 has a microcantilever 4 built in as a micromachine component at an element mounting space (in particular, operating space) defined by the silicon substrate 1 and lid 2. Further, while not shown, the active surface of the silicon substrate 1 has built into it, along with the microcantilever 4, an electronic circuit for operating it. The electronic circuit has electrodes 31 comprised of aluminum (Al). The illustrated electronic device 10 can be used for example as an accelerometer, microgyro, or other sensor.

The microcantilever 4 is built in the active surface of the silicon substrate 1 by micromachining technology and therefore it is not provided with bonding wires and the like. Therefore, the electronic device 10 can be made smaller and more compact as illustrated. Note that the substrate 1 with the attached microcantilever 4 will also be called as an "MEMS substrate" below.

The electronic device 10 is further provided with an ultrasonic bonded part 3. This ultrasonic bonded part 3, as illustrated and as explained with reference to FIGS. 11 and 12 below, is formed by connecting the Al electrodes 31 of the MEMS substrate 1 and the copper wiring patterns 26 of the circuit substrate 20, formed by processing the lid (silicon substrate) 2, through the gold bumps 27 formed on the copper wiring patterns 26. Note that instead of such Au—Al bonds, it is also possible to employ Au—Au bonds, Au—Cu bonds and the like. The outside of the ultrasonic bonded part 3 is sealed by an epoxy resin 32 so as to surround the part. Further, the copper pads 26 of the circuit substrate 20 have external connection terminals (solder balls) 33 attached to them.

Figure 4:
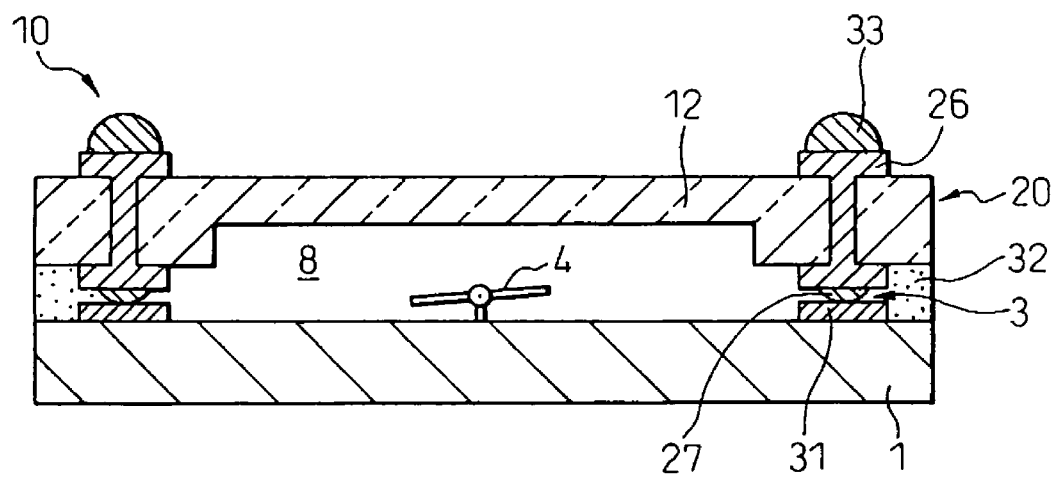
FIG. 4 is a sectional view of another preferable example of an MEMS element-mounted electronic device according to the present invention.

FIG. 4 shows a modification of an MEMS element mounting electronic device shown in FIG. 3. In this electronic device 10, the circuit substrate 20 is formed from a transparent glass substrate 12 instead of a silicon substrate 2. In this device 10, therefore, instead of the cantilever 4, it is possible to carry a DMD (Digital Mirror Device) or other optical MEMS element and the like to provide a new optical device. Of course, it is possible to use not just a transparent glass substrate, but also an optical lens and the like.

Figure 19:
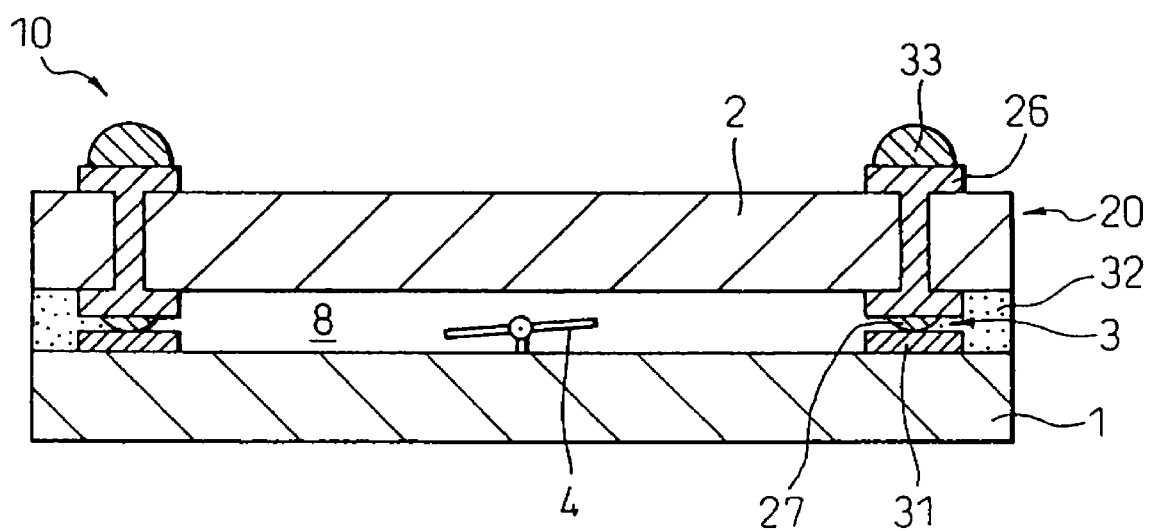
FIG. 19 is a sectional view of a modification of the MEMS element-mounted electronic device shown in FIG. 3.

In FIGS. 3 and 4, an example of providing a cavity in the silicon substrate 2 or glass substrate 12 of the circuit substrate 20 was shown. However, when it is possible to obtain a space not interfering with operation of the microcantilever 4 due to the total thickness of the wiring patterns 26, bumps, 27, and electrodes 31 of the circuit substrate 20, it is possible to omit the formation of the cavity in the substrate. FIG. 19 shows an example of eliminating the cavity from the silicon substrate 2 of FIG. 3. Note that in the case of the illustrated electronic device 10, the thickness of the electrodes 31 is about several μm, the thickness of the wiring patterns 26 is about several μm to 30 μm, and the thickness (height) of the bumps 27 is about 15 to 30 μm (after bonding, reduced to half to ⅔ of the original thickness).

Figure 5:
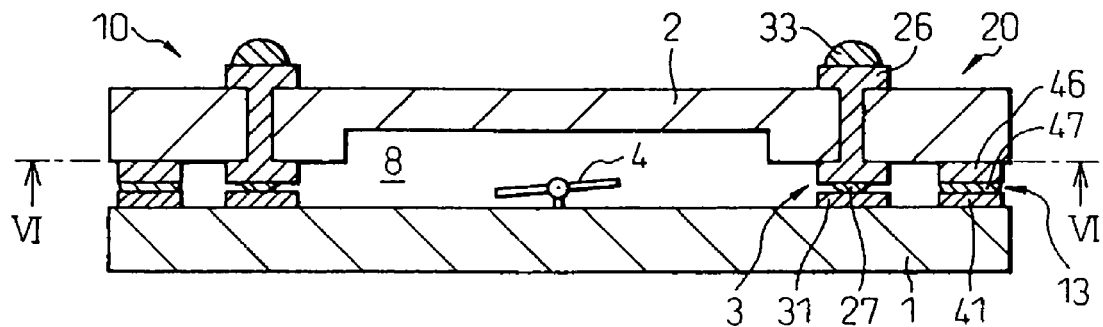
FIG. 5 is a sectional view of still another preferable example of an MEMS element-mounted electronic device according to the present invention.
Figure 6:
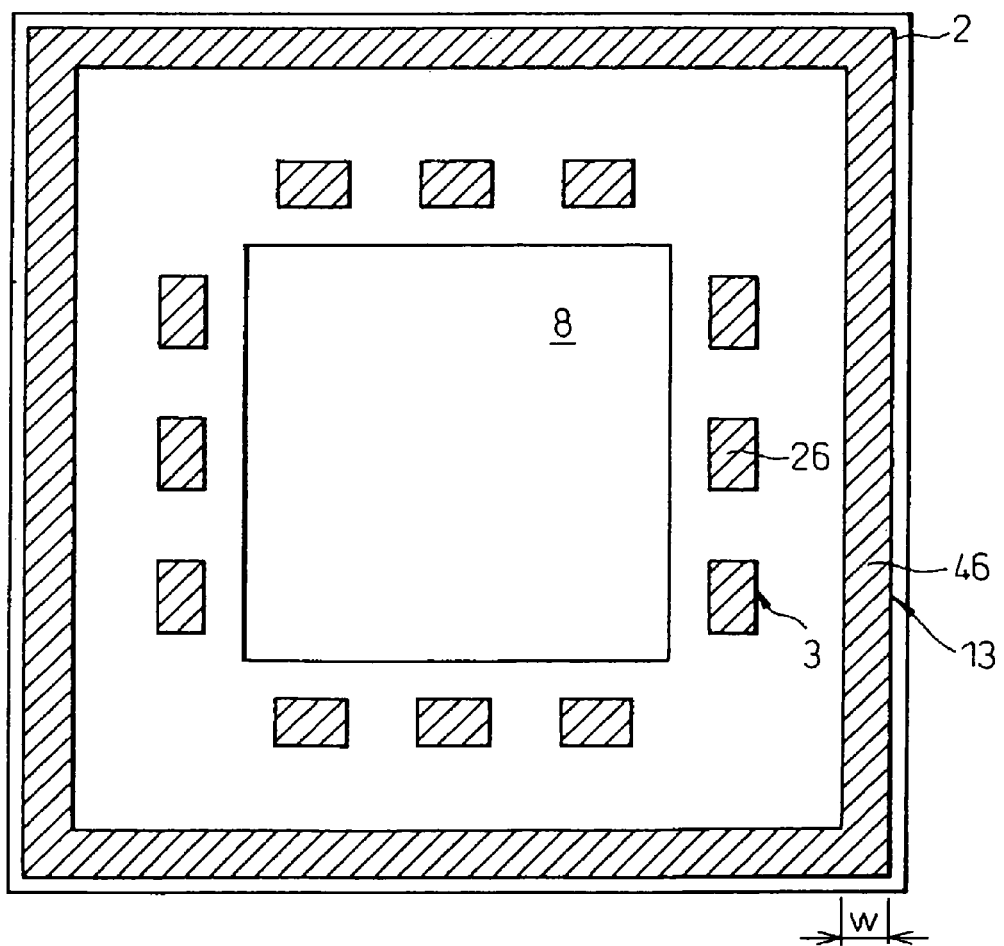
FIG. 6 is a bottom view when viewing a lid of an MEMS element-mounted electronic device shown in FIG. 5 in the direction of an arrow VI.

FIG. 5 shows another preferable example of an MEMS element mounting electronic device according to the present invention. While there is only the ultrasonic bonded part 3 in the electronic device 10 shown in FIG. 3, in this electronic device 10, as shown schematically in FIG. 6, another, that is, a second ultrasonic bonded part 13 is formed so as to surround the ultrasonic bonded part 3 for electrical connection. The second ultrasonic bonded part 13 is designed for air-tight sealing, and therefore it is formed in a frame shape along the outer periphery of the circuit substrate 20 (MEMS substrate 1). The frame width (w) of the ultrasonic bonded part 13 is more preferably narrow so long as the expected bonding effect can be obtained and usually is about 2 mm or less, more preferably about 1 mm or less.

The second ultrasonic bonded part 13 preferably can be formed simultaneously with the ultrasonic bonded part 3. First, a frame-like pattern (seal ring) 41 is formed on the MEMS substrate 1. Since this pattern is also built in at the step of producing the MEMS, the pattern 41 is comprised of aluminum or copper in the same way as the electrodes 31 of FIGS. 3 and 4.

For the lid 2, a frame-like pattern (seal ring) 46 comprised of copper is previously formed. This pattern can be formed in the same way as the wiring patterns 26 when forming the wiring patterns 26 on the lid. Next, the frame-like pattern 41 of the MEMS substrate 1 and the frame-like pattern 46 of the lid 2 are bonded. This step as well can be performed through the bumps 47 of gold in the same way as the ultrasonic bonded part 3. Alternatively, although not shown, it is advantageously possible to form Au—Al bonds by bonding patterns 46 plated with gold to the patterns 41 comprised of aluminum, to form Au—Cu bonds by gold plating the patterns 41 and bonding patterns 46 comprised of copper, or to form Au—Cu bonds by bonding patterns 46 plated by gold to patterns 41 comprised of copper. Note that when combining the present example with the example using no cavities such as the example of FIG. 19, in the formation of patterns 46 and 41 for forming seal rings on the lid 2 and the MEMS substrate 1, the total thickness of these patterns 46 and 41 and the plating for bonding the patterns (gold plating and the like) has to be at least the height (thickness) enabling acquisition of space enabling operation of the MEMS without interference. While not shown, it is also possible to coat the outside of the ultrasonic bonded part 13 with a sealing resin such as an epoxy resin. The copper pads 26 of the circuit substrate 20 has external connection terminals (solder balls) 33 attached to it.

Figure 7:
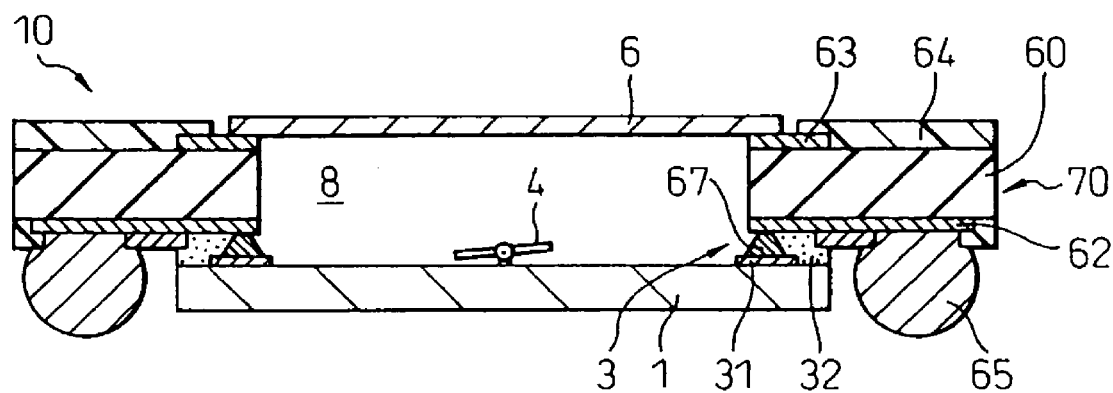
FIG. 7 is a sectional view of still another preferable example of an MEMS element-mounted electronic device according to the present invention.

FIG. 7 shows still another preferable example of an MEMS element mounting electronic device according to the present invention. The illustrated electronic device 10 utilizes an opening previously formed in the printed circuit board (double-sided copper clad laminate) 60 as an element mounting space 8. That is, the printed circuit board 60 corresponds to the "intermediate member" referred to in the present invention. An electronic device 10 is completed by ultrasonically bonding an MEMS substrate 1 having a cantilever 4, a circuit substrate 70 formed by processing the printed circuit board 60, and a lid (stainless steel plate) 6.

The ultrasonic bonded part 3, as shown, is formed by connecting the Al electrodes 31 of the MEMS substrate 1 and the copper wiring patterns 62 of the circuit substrate 70 through the gold bumps 67. The outside of the ultrasonic bonded part 3 is sealed by an epoxy resin 32 so as to surround it. Further, the copper wiring patterns 62 of the circuit substrate 70 also have external connection terminals (solder balls) 65 attached to them. Furthermore, the sealing pattern (seal ring) 63 formed by etching the copper foil of the circuit substrate 70 and the lid (stainless steel) 7 are also ultrasonically bonded. As illustrated, the lid 6 has no wiring pattern formed thereon.

Figure 8:
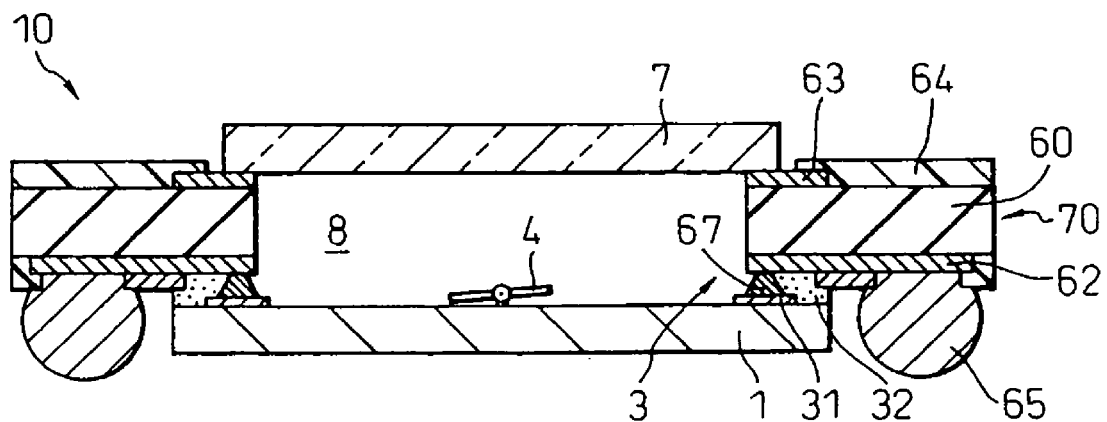
FIG. 8 is a sectional view of still another preferable example of an MEMS element-mounted electronic device according to the present invention.

FIG. 8 shows a modification of an MEMS element mounting electronic device shown in FIG. 7. In this electronic device 10, a lid 7 comprised of a transparent glass substrate is used instead of the lid 6 comprised of stainless steel plate. In this device 10, it is also possible to carry a DMD or other optical MEMS element and the like instead of a cantilever 4 to provide a new optical device. Of course, it is also possible to use not only a transparent glass substrate, but also an optical lens and the like. As illustrated, the lid 7 has no wiring pattern formed thereon.

In the MEMS element mounting electronic devices 10 shown in FIGS. 3 to 8, the illustrated examples each comprises only a micromachine component (microcantilever) 4 in the operating space 8. However, while not shown here, it is possible to carry a semiconductor element for driving the micromachine component on the active surface of the MEMS substrate 1, connect the element with electrodes on the MEMS substrate 1, and then seal the substrate 1 with the lid. The semiconductor device may be carried using a method as explained with reference to FIGS. 9 and 10 below.

The present invention, as explained above, includes not only an MEMS element mounting electronic device, but also a functional element mounting electronic device. An example of such an electronic device will be explained with reference to FIGS. 9 and 10.

Figure 9:
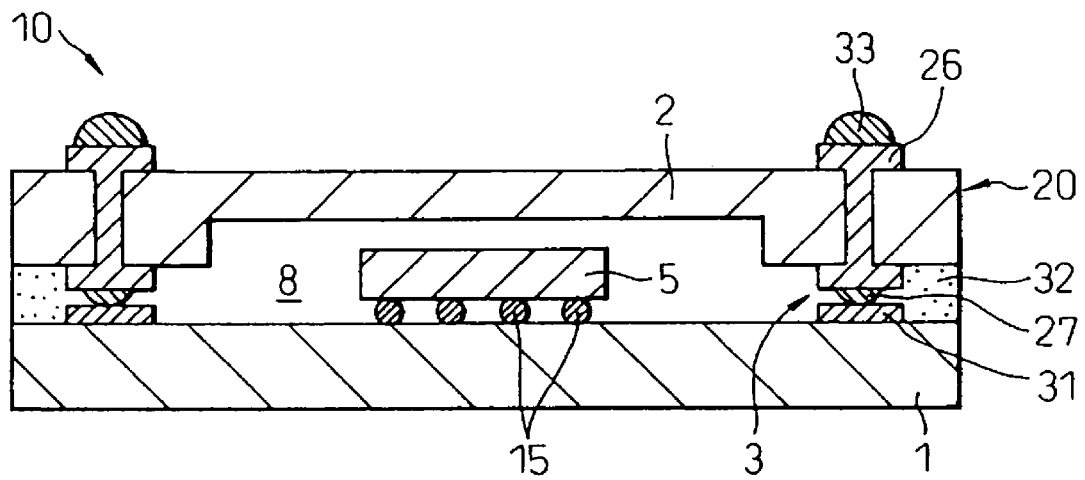
FIG. 9 is a sectional view of a preferable example of a functional element-mounted electronic device according to the present invention.

FIG. 9 shows a preferable example of a functional element mounting electronic device according to the present invention. This electronic device 10 has a configuration similar to the electronic device explained earlier with reference to FIG. 3, but to obtain actions and effects of the present invention by using other than an MEMS element, a semiconductor element (LSI chip) 5 is mounted by flip-chip connection, instead of an MEMS element. For flip-chip connection, gold bumps 15 are used. Note that in this type of electronic device, it is possible to sufficiently obtain the actions and effects derived from the ultrasonic bonding. In addition, if there is no inconveniences caused due to wire bonding, it is also possible to connect an illustrated LSI chip or other functional element by wire bonding.

Figure 10:
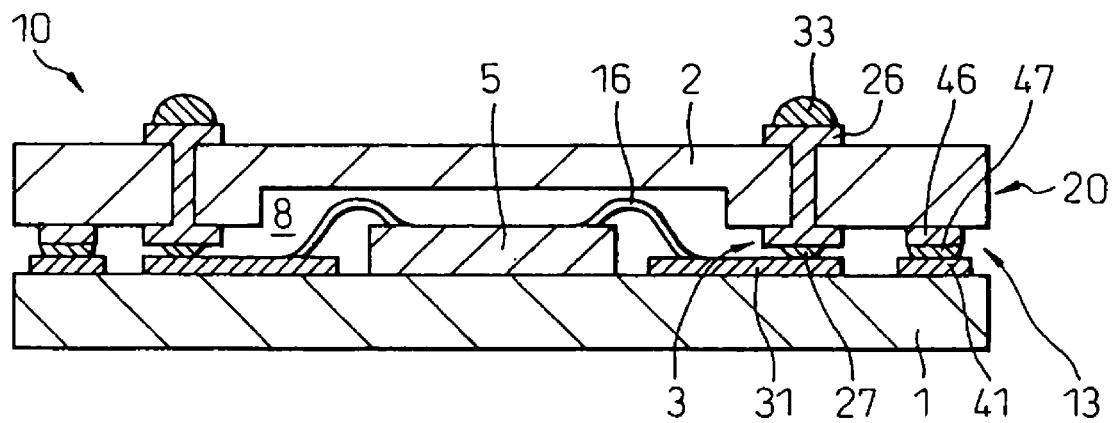
FIG. 10 is a sectional view of a preferable example of a lid securing method in an electronic device according to the present invention.

FIG. 10 is a sectional view showing a preferable example of a method of securing a lid in an electronic device according to the present invention. The illustrated functional element mounting electronic device 10 has a similar configuration as the MEMS element mounting electronic device 10 explained earlier with reference to FIG. 5. However, in the case of this example, since it was confirmed that the inconveniences due to wire bonding did not occur, the LSI chip 5 is connected with the Al electrodes 31 formed on the substrate 1 by bonding wires 16. Further, in the electronic device 10, as is illustrated, an ultrasonic bonded part 3 for electronic connection and an ultrasonic bonded part 13 for air-tight sealing are contained in combination.

Next, some production examples of the above-described and other electronic devices will be explained in detail.

Example 1

In this example, a suitable method of production of the MEMS element mounting electronic device shown in FIG. 3 will be explained with reference to FIGS. 11A to 11M.

Figure 11A:
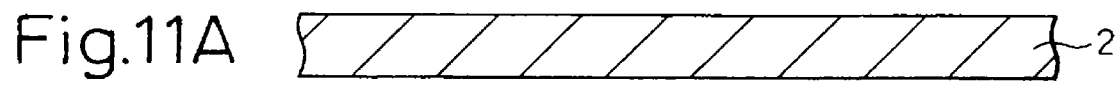
FIGS. 11A to 11M are sectional views showing, in sequence, a preferable method of production of an MEMS element-mounted electronic device shown in FIG. 3.

First, as shown in FIG. 11A, a silicon wafer 2 is prepared and is washed and dried to remove dirt and the like from the wafer surface.

Figure 11B:

Next, as shown in FIG. 11B, a photoresist 21 is coated at a predetermined thickness on one surface of the silicon wafer 2 and patterned to match with the cavity and through holes to be formed. The obtained resist pattern 21 is used as a mask to etch the underlying silicon wafer 2, thereby forming the cavity 12 and through holes (not yet completely opened) 24.

Here, the silicon wafer may be etched using various methods. For example, plasma etching, sputter etching, reactive ion etching, and other dry etching processes or wet etching processes using an etching solution may be used. In the case of plasma etching, for example, $CF_4$, $SF_6$ and the like may be used as the etching gas. Alternatively, it is also possible to form the cavity 12 by etching and form the through holes 24 by a $CO_2$ laser or YAG laser.

Figure 11C:
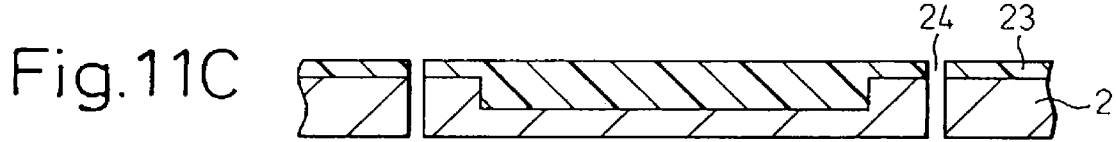

Next, to completely open the blocked through holes 24, as shown in FIG. 11C, a photoresist 23 is again coated so as to cover the cavity, and using the obtained resist pattern 23 as a mask, etching is again carried out.

Figure 11D:

After removing the photoresist used as a mask, as shown in FIG. 11D, heat treatment is performed in an oxidizing atmosphere. While not shown, a silicon oxide film ($SiO_2$) is formed as an insulating film on the surface of the silicon wafer 2. Regarding the formation of the silicon oxide film, reference should be made to FIG. 12 showing an example of forming an $SiO_2$ film 22 on the surface of the silicon wafer 2 and providing stud bumps 27. Further, in the step explained below with reference to FIG. 11H, the stud bumps 27 are formed directly over the copper-filled vias 26, but in actuality, as shown in FIG. 12, it is preferable to form the stud bumps 27 at positions avoiding those directly over the copper-filled vias 26. This is because there may be sometimes problems in the resulting surface flatness when the stud bumps 27 are formed directly above the vias 26. Therefore, as illustrated, solder balls 33 serving as external connection terminals are preferably formed avoiding the positions directly above the vias 26. Of course, if flatness is not a problem, it is also possible to form the stud bumps 27 and the solder balls 33 directly over the vias 26.

Figure 11E:
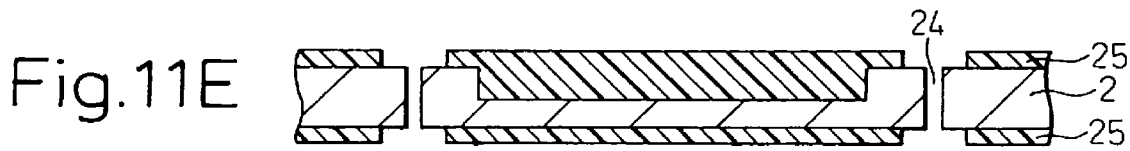

After finishing forming the silicon oxide film, while not shown, a power feed layer for electroplating to be performed next is formed by electroless plating of copper (may be replaced with sputtering of chrome and copper). Next, as shown in FIG. 11E, a photoresist 25 is coated at a predetermined thickness and patterned to expose parts for forming wirings.

Figure 11F:
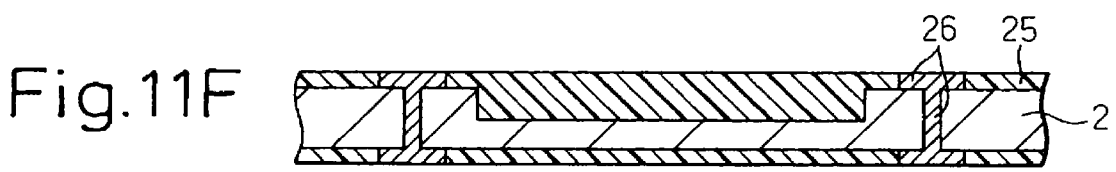

Next, as shown in FIG. 11F, power is fed from the power feed layer to electroplate copper. The resist pattern 25 obtained in the previous step functions as a mask so that a metal layer (copper layer; copper wiring patterns) 26 is formed on the exposed parts. Copper is also filled inside the through holes 24 whereby copper-filled vias 26 are formed. The wiring patterns 26 may be formed by other various types of methods, for example, substractive process, additive process and others. Note that at this stage, it is preferable to further nickel plate, gold plate, or otherwise treat the parts for serving as pads of the wiring patterns 26 so as to form a protective coating, after completion of the above copper electroplating.

Figure 11G:
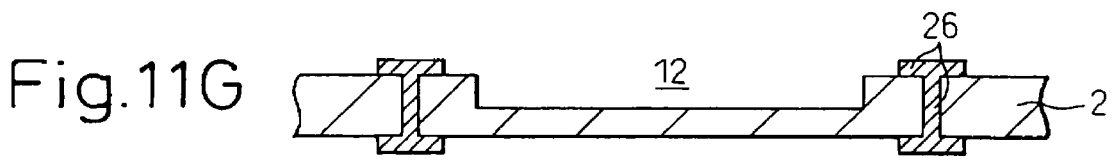

The used resist pattern is peeled off, then the power feed layer is etched away. As shown in FIG. 11G, a silicon wafer 2 provided with cavities 12 and wiring patterns 26 is obtained.

Figure 11H:
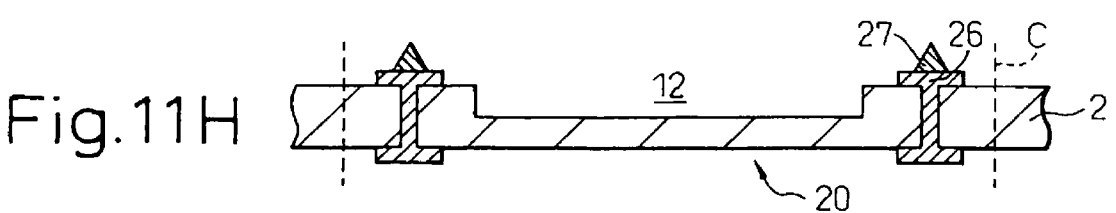
Figure 11:
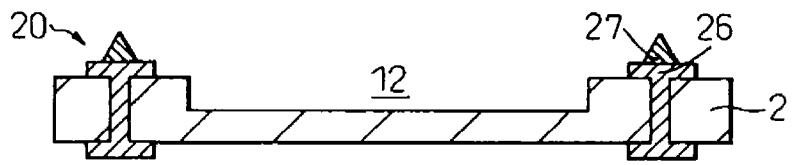
Figure 11:
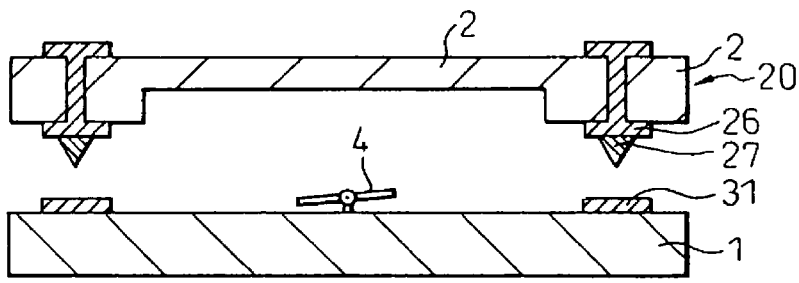
Figure 11:
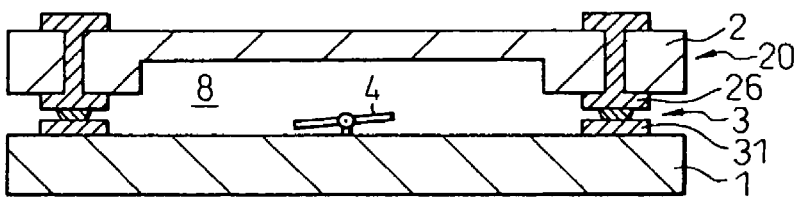
Figure 11:
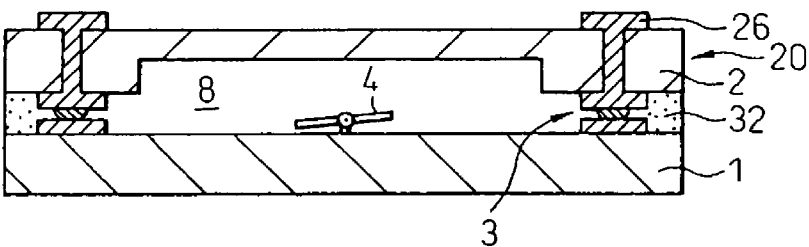
Figure 11:
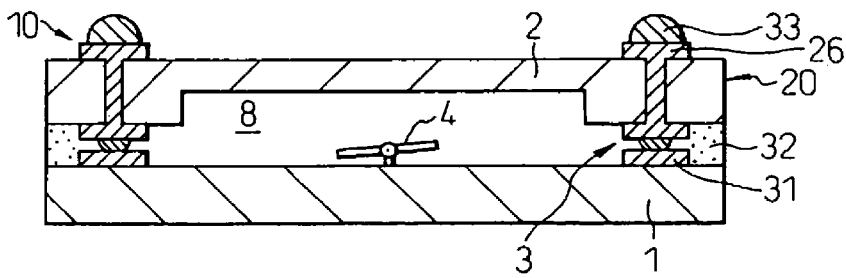
Figure 12:
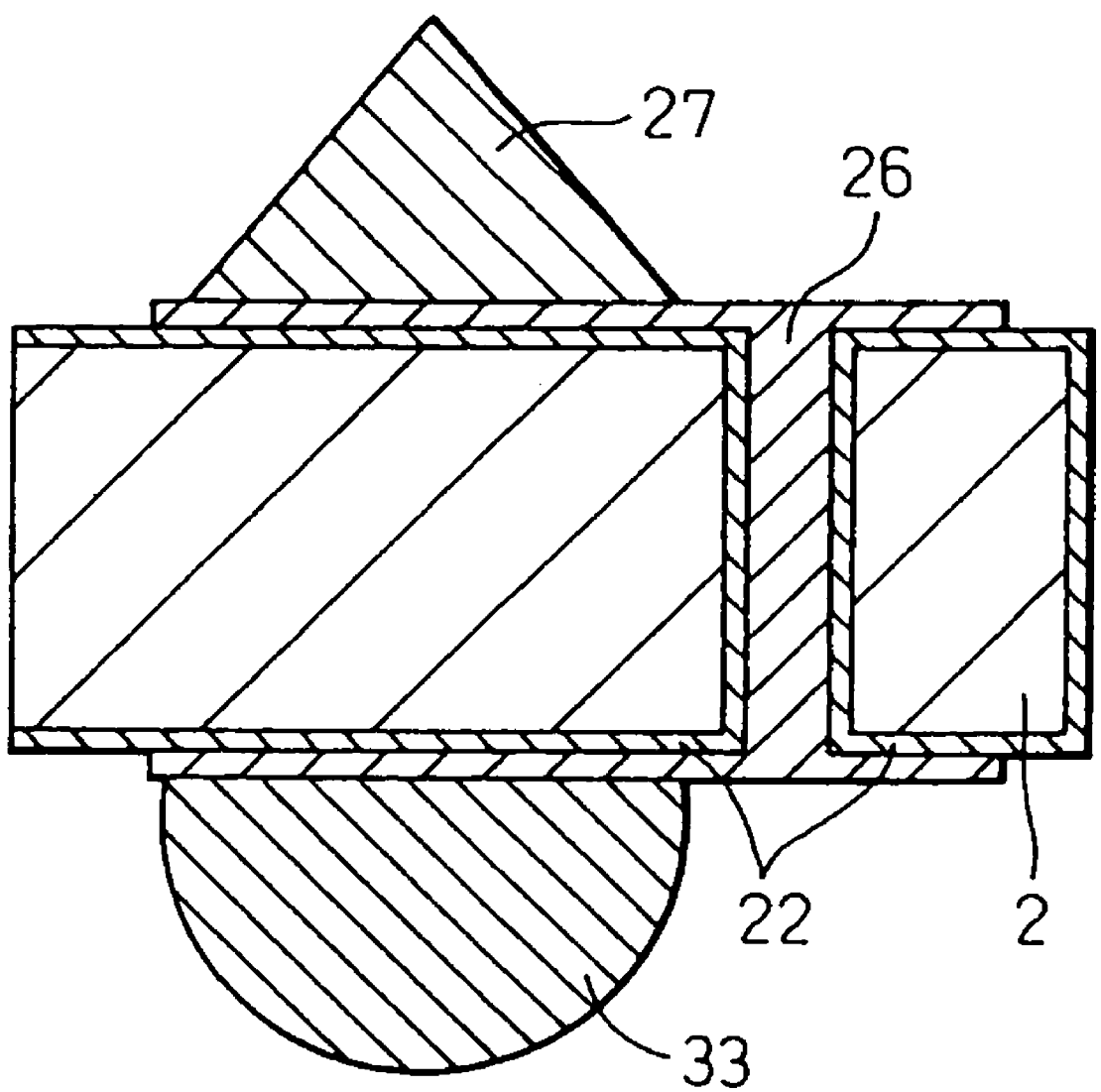
FIG. 12 is an enlarged sectional view showing a method of formation of a stud bump in the production step shown in FIG. 11H.

Subsequently, as shown in FIG. 11H, bumps 27 for bonding with the MEMS element mounting substrate (MEMS substrate) are formed on the pads of the wiring patterns 26. For example, it is possible to form gold stud bumps 27 by wire bonding. The stud bumps 27, as explained above, are preferably formed avoiding positions directly above the vias 26.

Thereafter, the silicon wafer 2 is cut along the cutting lines C to separate it into individual circuit substrates (packages) 20. This cutting may be performed using for example a dicer as is the general practice in this art. FIG. 11I shows one of the resulting circuit substrates 20.

Next, as shown in FIG. 11J, the silicon substrate (MEMS substrate) 1 having fabricated thereon the MEMS element (microcantilever) 4 is positioned with the circuit substrate 20. This positioning can be performed easily and accurately by using register marks and the like. previously given to the substrates.

After completion of positioning, as shown in FIG. 11K, the Al electrodes 31 of the MEMS substrate 1 are ultrasonically bonded with the wiring patterns 26 of the circuit substrate 20 through the gold bumps 27. The conditions of the ultrasonic bonding may be freely changed, but in general it is preferred that the treatment temperature is a room temperature to about 150° C., the amplitude frequency is about 50 to 100 kHz, the amplitude is about 1 to 10 μm, and the pressure is about 1 to 1,000 $g/mm^2$.

After the MEMS substrate 1 and the circuit substrate 20 were connected by ultrasonic bonding, as shown in FIG. 11L, a sealing resin (epoxy resin) 32 is injected by a dispenser (not shown) at the outside of the resulting ultrasonic bonded part 3 to make sealing.

Finally, as shown in FIG. 11M, external connection terminals (solder balls) 33 are applied on the pads of the wiring patterns 26 of the circuit substrate 20. The solder balls 33, as explained above, are preferably placed avoiding positions directly over the vias 26. An MEMS element mounting electronic device 10 such as explained with reference to FIG. 3 is thus completed.

The production method of an electronic device explained step by step above may be modified in various ways. For example, when changing the substrate of the circuit substrate 20 from a silicon substrate to a glass substrate, an MEMS element mounting electronic device 10 such as explained with reference to FIG. 4 above is completed. Note that in such a case, since a silicon substrate is not used, the step of forming a silicon oxide film is not required in the production process.

Example 2

In this example, a suitable method for producing an MEMS element mounting electronic device explained in FIG. 5 in accordance with the technique described in Example 1 will be explained with reference to FIGS. 13A to 13D.

Figure 13A:
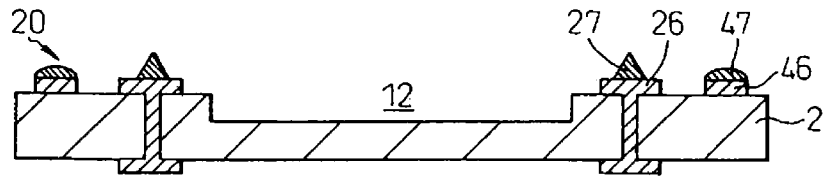
FIGS. 13A to 13D are sectional views showing, in sequence, a preferable method of production of an MEMS element-mounted electronic device shown in FIG. 5.

In this example, in addition to forming the copper wiring patterns 26 and the gold stud bumps 27 in accordance with the manner described in Example 1, as shown in FIG. 13A, a frame-like sealing pattern (seal ring) 46 is formed by copper electroplating on one surface (side to be bonded with MEMS substrate) of the circuit substrate 20, then a plating layer (for example, tin plating, gold plating and the like) 47 is formed over that. Note that in place of gold stud bumps 27, it is also possible to form bumps by gold plating at the same time as forming the plating layer 47.

Figure 13B:
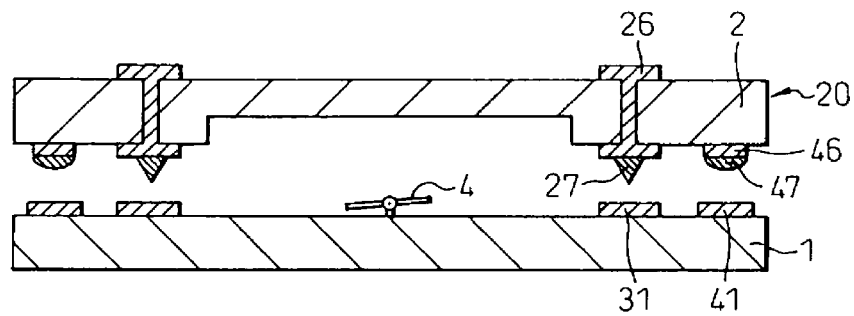

In addition to the circuit substrate 20, the MEMS substrate 1 is also subjected to similar treatment. That is, as shown in FIG. 13B, in addition to forming the Al electrodes 31 on the top surface of the MEMS substrate 1, a frame-like sealing pattern (seal ring) 41 is formed from aluminum, copper and the like at a position corresponding to the seal ring 46 of the circuit substrate 20.

After the treatment of the circuit substrate 20 and MEMS substrate 1 were completed as explained above, as shown in FIG. 13B, the MEMS substrate 1 having mounted thereon the MEMS element 4 is positioned with the circuit substrate 20.

Figure 13C:
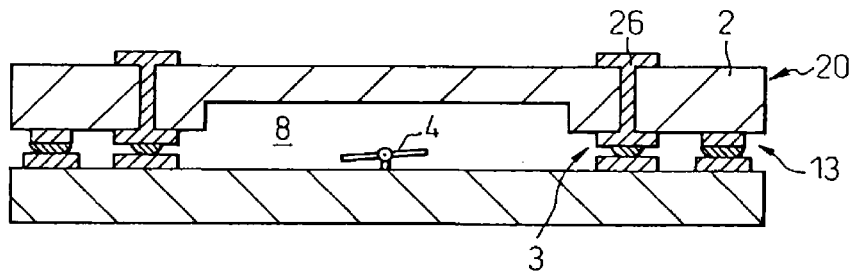

After the positioning was completed, as shown in FIG. 13C, the Al electrodes 31 of the MEMS substrate 1 are ultrasonically bonded with the wiring patterns 26 of the circuit substrate 20 through the gold bumps to form a first ultrasonic bonded part 3 and, at the same time, the seal ring 41 of the MEMS substrate 1 is ultrasonically bonded with the seal ring 46 of the circuit substrate 20 through the gold plating 47 to form a second ultrasonic bonded part 13. The conditions of the ultrasonic bonding are freely selected considering the conditions of the two bonding locations.

Figure 13D:
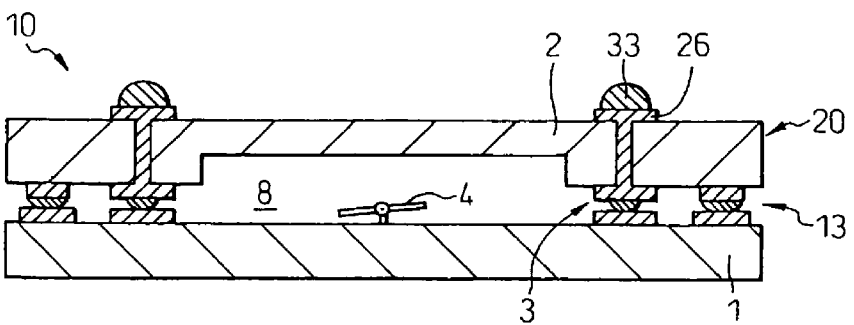

After the MEMS substrate 1 and the circuit substrate 20 were connected by ultrasonic bonding at the first ultrasonic bonded part 3 and second ultrasonic bonded part 13, as shown in FIG. 13D, the external connection terminals (solder balls) 33 are applied on the pads of the wiring patterns 26 of the circuit substrate 20. The MEMS element mounting electronic device 10 explained earlier with reference to FIG. 5 is thus completed.

Example 3

In this example, a modification of an MEMS element mounting electronic device shown in FIG. 3 and a preferred production method of the same will be explained with reference to FIGS. 14A to 14C. Using the production method described in this example, it is possible to provide an electronic device with a greater number of functions by building a semiconductor circuit into a silicon wafer or forming a capacitor, resistor, or other passive elements by a thin-film formation process and the like. Further, in this example, a silicon wafer is used, but, needless to say, it is possible to use a glass substrate or other substrate instead of the silicon wafer.

Figure 14A:
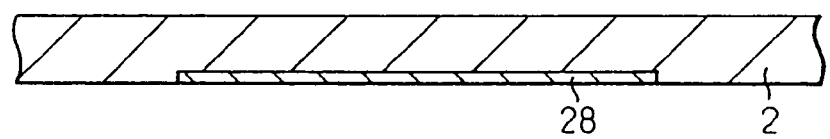
FIGS. 14A to 14C are sectional views showing, in sequence, a preferable method of production of an MEMS element-mounted electronic device according to the present invention.
Figure 14B:
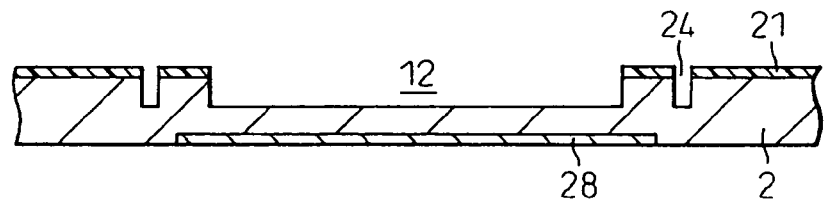
Figure 14C:
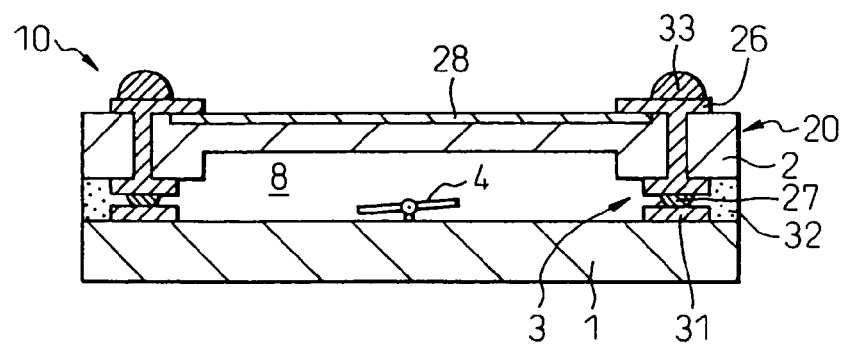

As shown in FIG. 14A, a silicon wafer 2 is prepared and a semiconductor circuits 28 are fabricated into its back surface (back surface of cavity-forming side). Next, as shown in FIG. 14B, a photoresist 21 is coated at a predetermined thickness on one surface of the silicon wafer 2 and is patterned in accordance with the cavities and through holes to be formed. Using the obtained resist pattern 21 as a mask for etching, the silicon wafer 2 is etched to form the cavities 12 and through holes (not yet completely opened) 24.

Thereafter, while not shown, the MEMS substrate 1 and the circuit substrate 20 are formed through a series of production steps explained with reference to FIGS. 11A to 11M. Then, as shown in FIG. 14C, the MEMS substrate 1 and the circuit substrate 20 are ultrasonically bonded. That is, the Al electrodes 31 of the MEMS substrate 1 are ultrasonically bonded with the wiring patterns 26 of the circuit substrate 20 through the gold bumps 27.

Next, a sealing resin (epoxy resin) 32 is injected at the outside of the formed ultrasonic bonded part 3 to make sealing. Next, external connection terminals (solder balls) 33 are applied on the pads of the wiring patterns 26 of the circuit substrate 20.

As a result, an MEMS element mounting electronic device 10 is completed. Here, the wiring patterns 26 of the circuit substrate 20 are formed so as to be connected with the semiconductor circuits 28, or capacitors, resistors, and other passive elements (not shown).

Example 4

In this example, another modification of the MEMS element mounting electronic device shown in FIG. 3 and a preferred production method of the same will be explained with reference to FIGS. 15A to 15C. Using the production method described in this example, it is possible to provide a compact high performance electronic device having a multi-layered wiring structure. Further, in this example, a silicon wafer is used, but, needless to say, it is possible to use a glass substrate or other substrate instead of the silicon wafer.

Figure 15A:
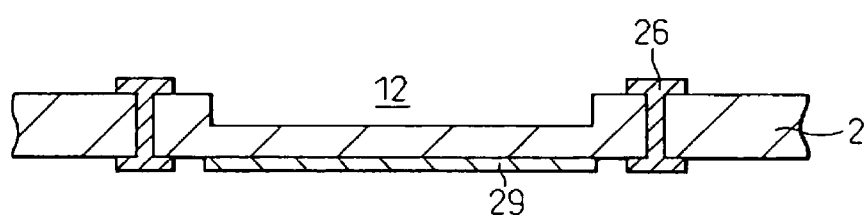
FIGS. 15A to 15C are sectional views showing, in sequence, a preferable method of production of an MEMS element-mounted electronic device according to the present invention.

After or during formation of the cavities 12 and copper wiring patterns (copper-filled vias) 26 in the silicon wafer 2 as described in Example 1, as shown in FIG. 15A, a ground plane 29 is formed at the back surface (surface on opposite side to cavities 12) of the silicon wafer 2.

Figure 15B:
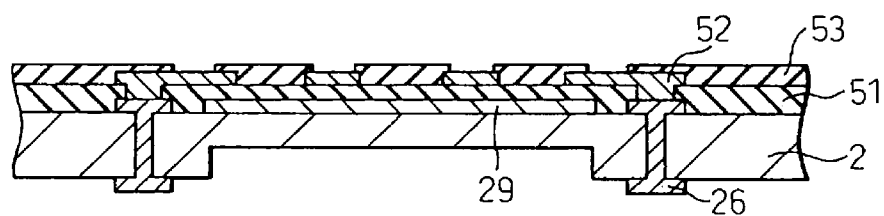
Figure 15C:
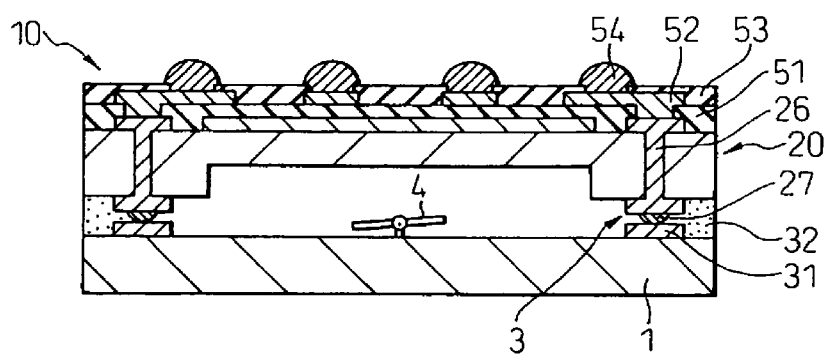

Next, as shown in FIG. 15B, an insulating layer 51, wiring layer 52, and insulating layer 53 are successively formed to form a multilayered wiring structure.

In the formation of the multilayered wiring structure, the insulating layers 51 and 53 each can be formed by coating an epoxy resin, a polyimide resin, or other insulating resin or stacking a film of these resins.

Further, the wiring layer (wiring patterns) 52 can be formed by the following techniques, for example.

The insulating layer is laser processed to form vias so that the underlying wiring patterns are exposed at the bottom surface. Note that when using a photosensitive resin for the insulating layer, it is possible to form vias by exposure and development of the insulating layer.

Next, the power feed layer for electroplating is formed on the surface (including insides of vias) of the insulating layer by copper electroless plating or sputtering of chrome and copper, and a resist pattern having exposed parts for forming wiring is formed.

Subsequently, power is fed from the power feed layer to electroplate copper and form a metal layer (wiring layer). The previously formed resist pattern acts as a mask during plating. Further, after the electroplating of copper was completed in this way, nickel plating, gold plating, or other protective plating is applied.

Thereafter, the used resist pattern is peeled off and the power feed layer is etched away to obtain the desired wiring patterns 52. The insides of the vias of the insulating layer 51 are filled by copper. The wiring patterns 52 may be formed by, for example, a substractive process or an additive process.

Next, while not shown, the MEMS substrate 1 and the circuit substrate 20 are produced through a series of production steps explained earlier with reference to FIGS. 11A to 11M. Then, as shown in FIG. 15C, the MEMS substrate 1 and the circuit substrate 20 are ultrasonically bonded. That is, the Al electrodes 31 of the MEMS substrate 1 are ultrasonically bonded with the wiring patterns 26 of the circuit substrate 20 through the gold bumps 27. Then, the outside of the formed ultrasonic bonded part 3 is sealed by an epoxy resin 32. Further, external connection terminals (solder balls) 54 are applied on the exposed wiring patterns 52 of the circuit substrate 20.

Example 5

In this example, three different methods of producing an MEMS element mounting electronic device shown in FIG. 3 using a wafer level package process will be explained with reference to FIGS. 16A to 16C.

Figure 16A:
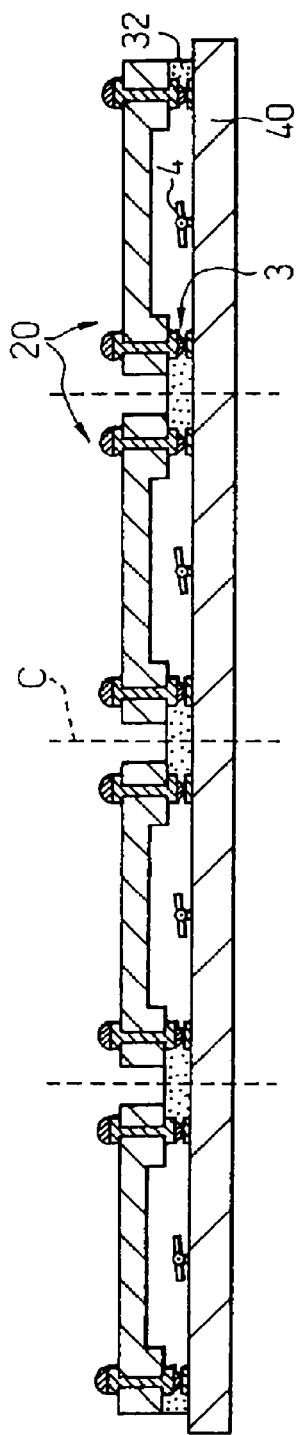
FIGS. 16A to 16C are sectional views of several examples of preferable methods of production of an MEMS element-mounted electronic device according to the present invention using a wafer level process.

First Production Method:

As shown in FIG. 16A, individual circuit substrates 20 fabricated by the technique described in Example 1 are connected to a silicon wafer 40 having formed thereon a plurality of MEMS elements 4 in accordance with the manner described in Example 1 to form ultrasonic welded parts 3. An epoxy resin 32 is injected by a dispenser to make sealing, and then the silicon wafer 1 is diced along the cutting lines C. Individual MEMS element mounting electronic devices such as shown in FIG. 3 are thus obtained.

Figure 16B:
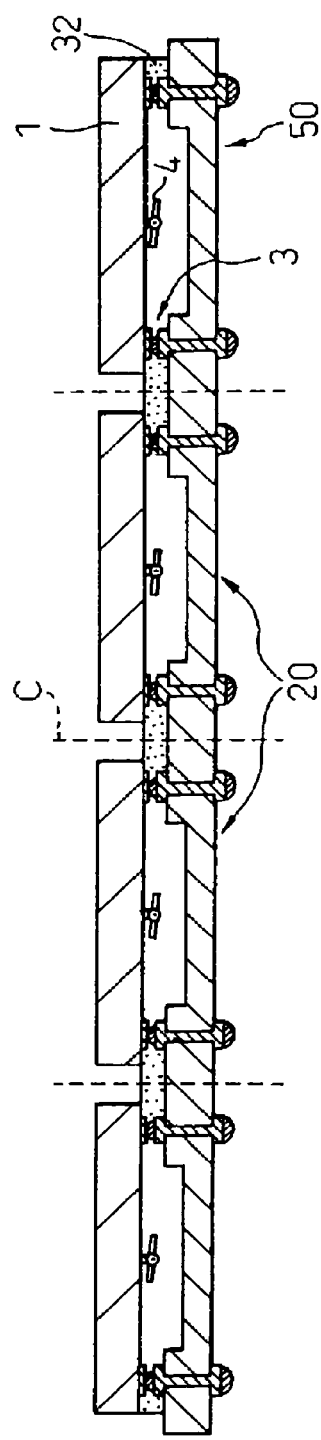

Second Production Method:

As shown in FIG. 16B, a large-sized circuit substrate 50 with a plurality of circuit substrates 20 is prepared. The circuit substrate 50 can be fabricated by the technique described in Example 1. Next, individual MEMS substrates 1 having formed thereon the MEMS elements 4 are connected to the large-sized circuit substrate 50 to form ultrasonic welded parts 3. An epoxy resin 32 is injected by a dispenser to make sealing, and then the circuit substrate 50 is diced along the cutting lines C. Individual MEMS element mounting electronic devices such as shown in FIG. 3 are thus obtained.

Figure 16C:
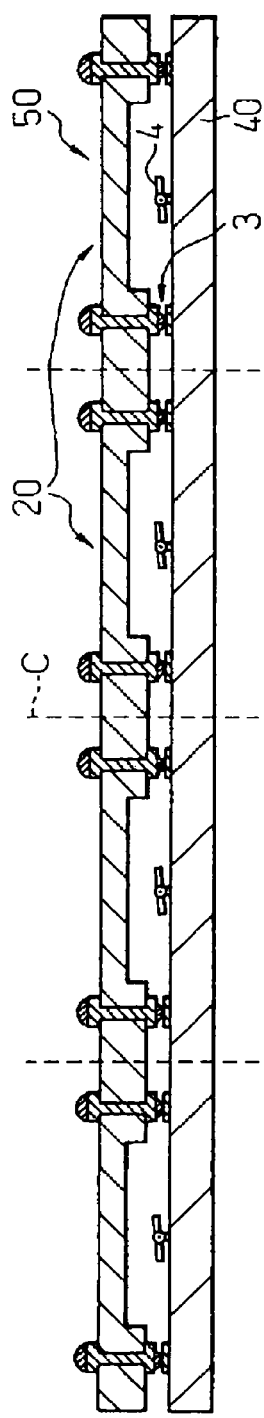

Third Production Method:

As shown in FIG. 16C, a silicon wafer 40 having formed thereon a plurality of MEMS elements 4 and a large-sized circuit substrate 50 with a plurality of circuit substrates 20 are prepared. The circuit substrate 50 can be fabricated by the technique described in Example 1. Next, the large-sized circuit substrate 50 and silicon wafer 40 are connected to form ultrasonic bonded parts 3. Next, the circuit substrate 50 and the silicon wafer 40 are diced along the cutting lines C. An epoxy resin (not shown) is injected by a dispenser to make sealing. Individual MEMS element mounting electronic devices such as shown in FIG. 3 are obtained.

Example 6

In this example, a preferred method of production of an MEMS element mounting electronic device shown in FIG. 7 will be explained with reference to FIGS. 17A to 17F.

Figure 17A:
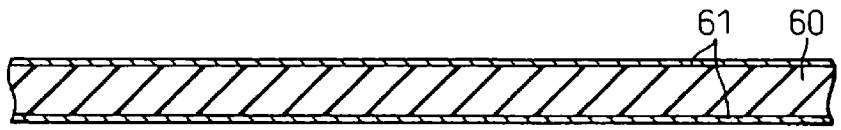
FIGS. 17A to 17F are sectional views showing, in sequence, a preferable method of production of an MEMS element-mounted electronic device shown in FIG. 7.

First, as shown in FIG. 17A, a double-sided copper clad laminate 60 comprising a glass prepreg impregnated with an epoxy resin and laminated with copper foil 61 is prepared.

Figure 17B:
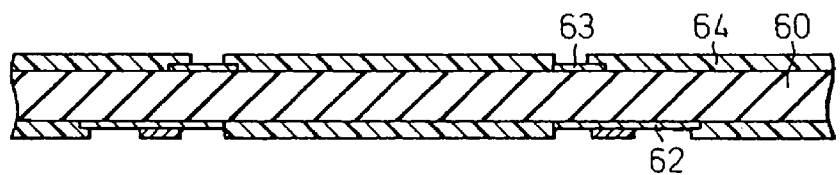

Next, as shown in FIG. 17B, the copper foil 61 is etched to form the wiring patterns 62 and sealing patterns (seal rings) 63. Further, a solder resist 64 is applied at a predetermined thickness. In the wiring patterns 62, while not shown, the portions exposed from the solder resist 64 are plated with nickel or gold.

Figure 17C:
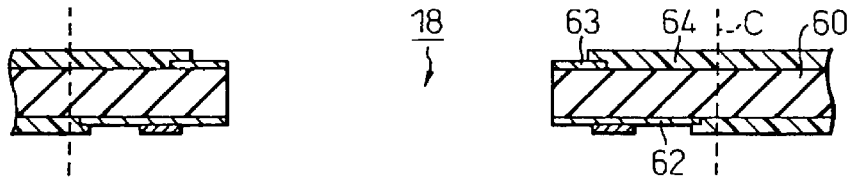

Next, as shown in FIG. 17C, openings 18 are formed by counter boring. Note that the openings 18 may also be formed by punching by a press instead of counter boring.

Figure 17D:
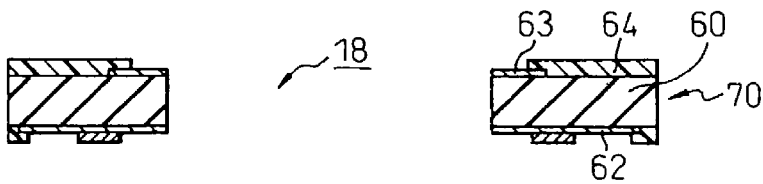

After formation of the openings, the laminate 60 is cut along the cutting lines C. As shown in FIG. 17D, individual circuit substrates 70 are thus obtained.

Figure 17E:
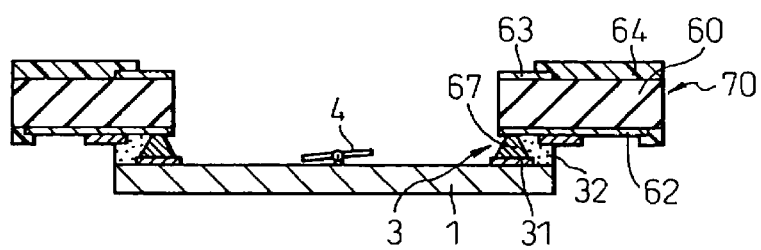

Next, as shown in FIG. 17E, an MEMS substrate 1 mounting thereon an MEMS element 4 is positioned with the circuit substrate 70 and ultrasonically bonded. The Al electrodes 31 of the MEMS substrate 1 are connected with the wiring patterns 62 of the circuit substrate 70 through the gold bumps 67, to thereby complete the ultrasonic bonded part 3. As illustrated, an epoxy resin 32 is injected for sealing at the outside of the ultrasonic bonded part 3.

Figure 17F:
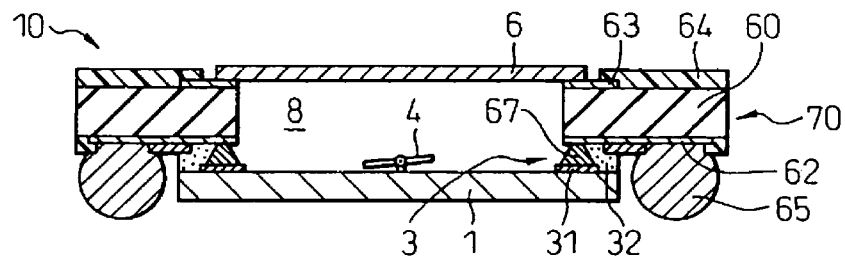

Thereafter, as shown in FIG. 17F, the cavity 8 is closed by the lid (stainless steel plate) 6, and the lid 6 and seal ring 63 of the circuit substrate 70 are ultrasonically bonded. The cavity 8 with the mounted MEMS element 4 becomes completely hermetic in state. Further, external connection terminals (solder balls) 65 are applied on the exposed wiring patterns 62 of the circuit substrate 70. An MEMS element mounting electronic device 10 such as explained with reference to FIG. 7 earlier is thus obtained.

Particularly, the above production method can be carried out more efficiently and at lower cost by utilizing the technique described in Example 5.

Further, in this example, a double-sided copper clad laminate was used as the intermediate member, but instead of this it is also possible to use for example a silicon substrate or glass substrate, thereby producing an MEMS element mounting electronic device having the similar structure. In this case, the wiring patterns and the opening may be formed using the technique described in Example 1.

Example 7

In this example, another preferable example of an MEMS element mounting electronic device according to the present invention and a preferred method of production of the same will be explained with reference to FIGS. 18A to 18G.

Figure 18A:
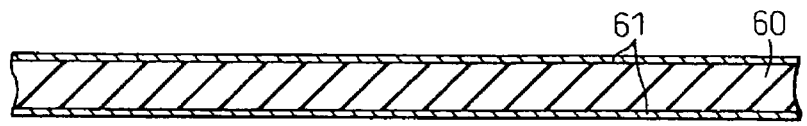
FIGS. 18A to 18G are sectional views showing, in sequence, a preferable method of production of an MEMS element-mounted electronic device according to the present invention.

First, as shown in FIG. 18A, a double-sided copper clad laminate 60 comprising a glass prepreg impregnated with an epoxy resin and laminated with copper foil 61 is prepared.

Figure 18B:
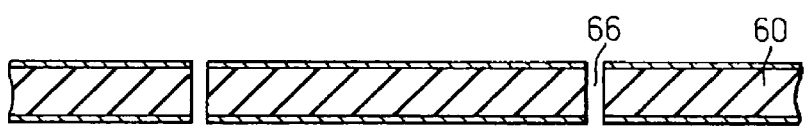

Next, as shown in FIG. 18B, through holes 66 are formed at predetermined locations of the laminate 60. The through holes 66 can be formed by for example by drilling.

Figure 18C:
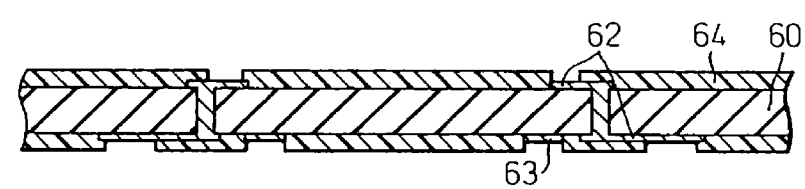

Subsequently, as shown in FIG. 18C, using the conventional wiring formation method (for example, substractive process) for printed circuit boards, plating and etching are carried out to form the wiring patterns 62 and sealing patterns (seal rings) 63. Further, a solder resist 64 is applied at a predetermined thickness. In the wiring patterns 62, while not shown, the portions exposed from the solder resist 64 are plated with nickel or gold.

Figure 18D:
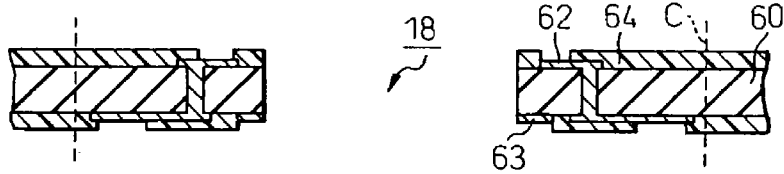

Next, as shown in FIG. 18D, openings 18 are formed by counter boring. Note that the openings 18 may also be formed by punching by a press instead of counter boring.

Figure 18E:
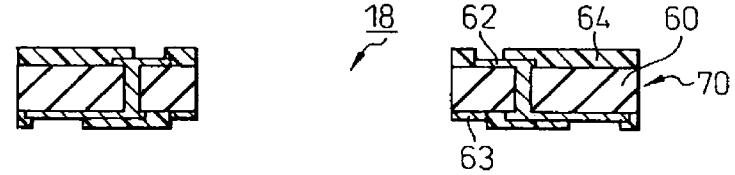

After formation of the openings, the laminate 60 is cut along the cutting lines C. As shown in FIG. 18E, individual circuit substrates 70 are thus obtained.

Figure 18F:
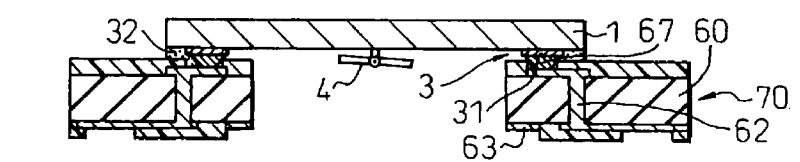

Next, as shown in FIG. 18F, an MEMS substrate 1 mounting thereon an MEMS element 4 is positioned with the circuit substrate 70 and ultrasonically bonded. The Al electrodes 31 of the MEMS substrate 1 are connected with the wiring patterns 62 of the circuit substrate 70 through the gold bumps 67 to thereby complete the ultrasonic bonded part 3. As illustrated, an epoxy resin 32 is injected for sealing at the outside of the ultrasonic bonded part 3.

Figure 18G:
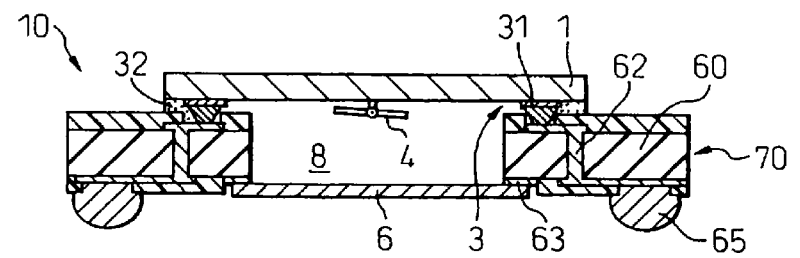

Next, as shown in FIG. 18G, the cavity 8 is closed by a lid (stainless steel plate) 6, and the lid 6 and seal ring 63 of the circuit substrate 70 are ultrasonically bonded. The cavity 8 with the mounted MEMS element 4 becomes completely hermetic in state. Further, external connection terminals (solder balls) 65 are applied on the exposed wiring patterns 62 of the circuit substrate 70. An MEMS element mounting electronic device 10 is thus obtained.

Particularly, the above production method can be carried out more efficiently and at lower cost by utilizing the technique described in Example 5.

Further, in this example, a double-sided copper clad laminate was used as the intermediate member, but instead of this it is also possible to use for example a silicon substrate or glass substrate, thereby producing an MEMS element mounting electronic device having the similar structure. In this case, the wiring patterns and the opening may be formed using the technique described in Example 1.

Hereinabove, the present invention was explained with regard to its preferred examples while referring to the attached drawings. In each of the illustrated electronic devices, pads (wiring patterns) are formed at only the edges of the cover and bumps are formed on those pads, however, the electronic devices of the present invention may be widely varied. For example, it is also possible to reroute wiring patterns 26 on the upper surface of the lid 2, provide a large number of pads (wiring patterns) in an array-like distribution, and form bumps on each of the pads.

As explained above in detail, according to the present invention, it becomes possible to provide not only an electronic device for mounting an MEMS element and the like which is small and compact, but also an electronic device which is free from deterioration of the device characteristics due to heat treatment etc. and is completely sealed air-tight. The electronic device is particularly suitable for mounting a functional element which is sensitive to heat treatment due to use of a driving component such as an MEMS element.

Further, in the electronic device of the present invention, since flip-chip connection and ultrasonic bonding are introduced in the production process, it becomes possible to integrally build in another functional element, for example, a driving component, a passive component and the like with the SEMS element, thus enabling to make the device smaller and more compact.

Furthermore, the electronic device of the present invention can be easily produced by a method comprised of simple production steps. In particular, the electronic device of the present invention can be produced by a wafer level package process, so costs can be greatly reduced.

What is claimed is:

1. A method of production of an electronic device having mounted thereon a microelectromechanical system element, which comprises the steps of:
    forming a micromachine component and electronic component for operation of said micromachine component on a substrate to form said system element;
    forming a lid provided with conductor-filled vias formed passing through the lid in a thickness direction thereof, and wiring patterns connected with an end surface of the vias;
    bonding to said substrate said lid covering an active surface of said substrate to define an operating space for said micromachine component and electrically connecting, via bumps, electrodes of said substrate and the wiring patterns of said lid at a bonded part of said substrate and said lid; and
    forming, at said substrate, said lid, a continuous ultrasonic bonded part in contact with at an outer periphery of said operating space side of said substrate and said lid without interruption.

2. A method of production of an electronic device as set forth in claim 1, in which said bonded part is formed by ultrasonic bonding of said substrate and said lid.

3. A method of production of an electronic device as set forth in claim 1 or 2, which further comprises a step of forming at said substrate and/or said lid a cavity at an operating spaceside thereof.

4. A method of production of an electronic device as set forth in claim 1 or 2, which further comprises a step of arranging between said substrate and a lid having no wiring pattern an intermediate member provided with an opening for operation of said micromachine component and wiring patterns, and electrically connecting said electronic component and the wiring patterns of said intermediate member.

5. A method of production of an electronic device as set forth in claim 2, which further comprises a step of forming an intermediate member arranged in accordance with need between said substrate and said lid.

6. A method of production of an electronic device as set forth in claim 1 or 2, which further comprises a step of applying a sealing resin to the outside of said bonded part to surround and bond the same.

7. A method of production of an electronic device having mounted thereon a microelectromechanical system element, which comprises the steps of:
    forming a micromachine component and electronic component for operation of said micromachine component on a substrate to form said system element;
    forming a lid provided with conductor-filled vias formed passing through the lid in a thickness direction thereof, and wiring patterns connected with an end surface of the vias;
    bonding to said substrate said lid covering an active surface of said substrate to define an operating space for said micromachine component and electrically connecting, via bumps, electrodes of said substrate and the wiring patterns of said lid at a bonded part of said substrate and said lid;
    batch-wise producing a plurality of said electronic devices at the same time by a wafer level package process, then cutting out the individual electronic devices; and
    forming, at said substrate, said lid, a continuous ultrasonic bonded part in contact with at an outer periphery of said operating space side of said substrate and said lid without interruption.

8. A method of production of an electronic device as set forth in claim 7, in which said bonded part is formed by ultrasonic bonding of said substrate and said lid.

9. A method of production of an electronic device as set forth in claim 7 or 8, which further comprises a step of forming at said substrate and/or said lid a cavity at an operating space side thereof.

10. A method of production of an electronic device as set forth in claim 7 or 8, which further comprises a step of arranging between said substrate and a lid having no wiring pattern an intermediate member provided with an opening for operation of said micromachine component and wiring patterns, and electrically connecting said electronic component and the wiring patterns of said intermediate member.

11. A method of production of an electronic device as set forth in claim 8, which further comprises a step of forming, at said substrate, said lid, and an intermediate member arranged in accordance with need between said substrate and said lid, a second continuous ultrasonic bonded part in contact with at an outer periphery of said operating space side of said substrate and other members without interruption.

12. A method of production of an electronic device as set forth in claim 7 or 8, which further comprises a step of applying a sealing resin to the outside of said bonded part to surround and bond the same.

* * * * *